US010636775B2

(12) United States Patent
Chen et al.

(10) Patent No.: US 10,636,775 B2
(45) Date of Patent: Apr. 28, 2020

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Wei-Yu Chen, New Taipei (TW); An-Jhih Su, Taoyuan (TW); Chi-Hsi Wu, Hsinchu (TW); Der-Chyang Yeh, Hsin-Chu (TW); Li-Hsien Huang, Hsinchu County (TW); Po-Hao Tsai, Taoyuan (TW); Ming-Shih Yeh, Hsinchu (TW); Ta-Wei Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/795,280

(22) Filed: Oct. 27, 2017

(65) Prior Publication Data

US 2019/0131283 A1 May 2, 2019

(51) Int. Cl.
*H01L 25/10* (2006.01)
*H01L 23/31* (2006.01)
(Continued)

(52) U.S. Cl.
CPC .......... *H01L 25/105* (2013.01); *H01L 21/561* (2013.01); *H01L 21/563* (2013.01);
(Continued)

(58) Field of Classification Search
CPC .............. H01L 25/105; H01L 23/3121; H01L 23/3142; H01L 23/481; H01L 23/5389;
(Continued)

(56) References Cited

U.S. PATENT DOCUMENTS 5,726,493 A * 3/1998 Yamashita .......... H01L 23/3128
257/686
6,740,964 B2 * 5/2004 Sasaki ................. H01L 23/3128
257/678

(Continued)

*Primary Examiner* — Peniel M Gumedzoe
(74) *Attorney, Agent, or Firm* — JCIPRNET

(57) ABSTRACT

A package structure and the manufacturing method thereof are provided. The package structure includes a first package including at least one first semiconductor die encapsulated in an insulating encapsulation and through insulator vias electrically connected to the at least one first semiconductor die, a second package including at least one second semiconductor die and conductive pads electrically connected to the at least one second semiconductor die, and solder joints located between the first package and the second package. The through insulator vias are encapsulated in the insulating encapsulation. The first package and the second package are electrically connected through the solder joints. A maximum size of the solder joints is greater than a maximum size of the through insulator vias measuring along a horizontal direction, and is greater than or substantially equal to a maximum size of the conductive pads measuring along the horizontal direction.

20 Claims, 22 Drawing Sheets

PS1

(51) Int. Cl.
*H01L 23/48* (2006.01)
*H01L 23/00* (2006.01)
*H01L 21/768* (2006.01)
*H01L 25/00* (2006.01)
*H01L 21/56* (2006.01)
*H01L 21/683* (2006.01)
*H01L 23/538* (2006.01)
*H01L 25/065* (2006.01)

(52) U.S. Cl.
CPC ........ *H01L 21/568* (2013.01); *H01L 21/6835* (2013.01); *H01L 21/76802* (2013.01); *H01L 23/3121* (2013.01); *H01L 23/3142* (2013.01); *H01L 23/481* (2013.01); *H01L 23/5389* (2013.01); *H01L 24/05* (2013.01); *H01L 24/19* (2013.01); *H01L 24/20* (2013.01); *H01L 24/24* (2013.01); *H01L 24/96* (2013.01); *H01L 24/97* (2013.01); *H01L 25/50* (2013.01); *H01L 23/3128* (2013.01); *H01L 24/48* (2013.01); *H01L 25/0657* (2013.01); *H01L 2221/68345* (2013.01); *H01L 2221/68359* (2013.01); *H01L 2224/211* (2013.01); *H01L 2224/24145* (2013.01); *H01L 2224/48091* (2013.01); *H01L 2224/48227* (2013.01); *H01L 2225/0651* (2013.01); *H01L 2225/06527* (2013.01); *H01L 2225/06548* (2013.01); *H01L 2225/06568* (2013.01); *H01L 2225/06586* (2013.01); *H01L 2225/1035* (2013.01); *H01L 2225/1058* (2013.01); *H01L 2924/00014* (2013.01); *H01L 2924/1433* (2013.01); *H01L 2924/1436* (2013.01); *H01L 2924/181* (2013.01)

(58) Field of Classification Search
CPC ......... H01L 24/05; H01L 24/19; H01L 24/20; H01L 24/24; H01L 24/96; H01L 21/563; H01L 21/561; H01L 21/568; H01L 21/76802
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2007/0181989 A1* | 8/2007 | Corisis | H01L 21/561 257/686 |
| 2008/0169548 A1* | 7/2008 | Baek | H01L 23/5389 257/686 |
| 2011/0115081 A1* | 5/2011 | Osumi | H01L 23/49811 257/737 |
| 2011/0215449 A1* | 9/2011 | Camacho | H01L 23/28 257/659 |
| 2011/0278736 A1* | 11/2011 | Lin | H01L 25/50 257/774 |
| 2013/0069222 A1* | 3/2013 | Camacho | H01L 23/49827 257/737 |
| 2013/0241057 A1* | 9/2013 | Yu | H01L 25/0657 257/738 |
| 2014/0210101 A1* | 7/2014 | Lin | H01L 24/19 257/774 |
| 2015/0035148 A1* | 2/2015 | Lee | H01L 23/49811 257/738 |
| 2015/0145142 A1* | 5/2015 | Lin | H01L 25/50 257/774 |
| 2015/0228580 A1* | 8/2015 | Chen | H01L 24/27 257/531 |
| 2016/0013144 A1* | 1/2016 | Chen | H01L 23/3128 257/774 |
| 2016/0240465 A1* | 8/2016 | Chen | H01L 21/486 |
| 2016/0351494 A1* | 12/2016 | Chen | H01L 23/5226 |
| 2017/0133351 A1* | 5/2017 | Su | H01L 25/50 |
| 2017/0243826 A1* | 8/2017 | Lin | H01L 21/4853 |
| 2017/0373010 A1* | 12/2017 | Lee | H01L 23/5386 |
| 2018/0108638 A1* | 4/2018 | Lin | H01L 25/105 |

\* cited by examiner

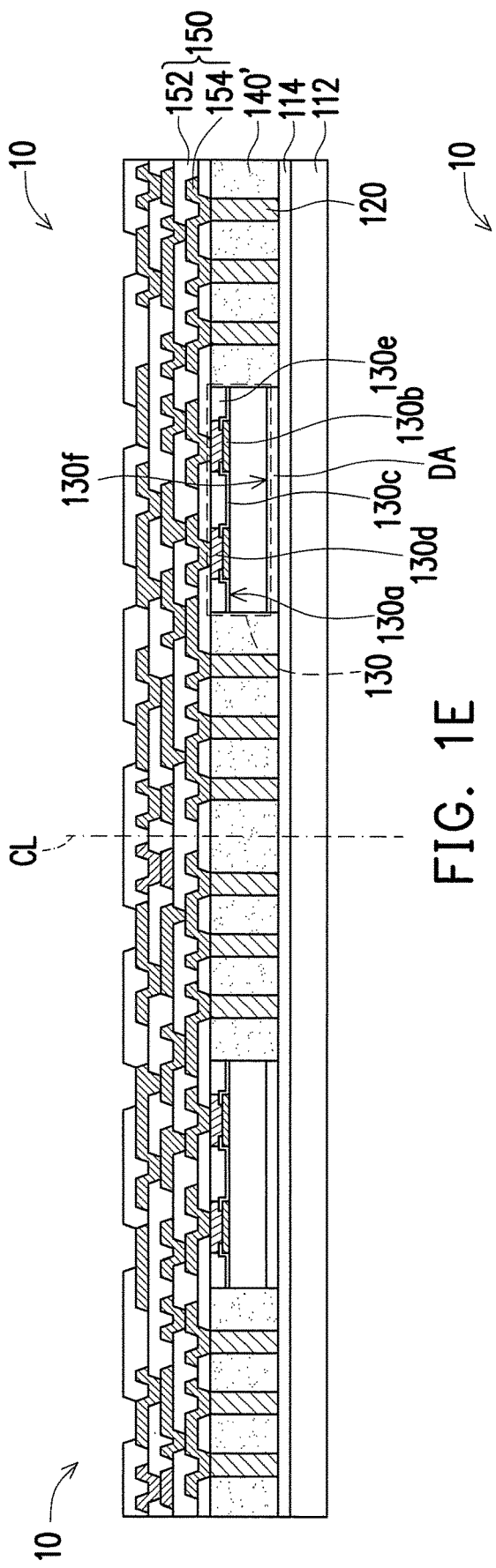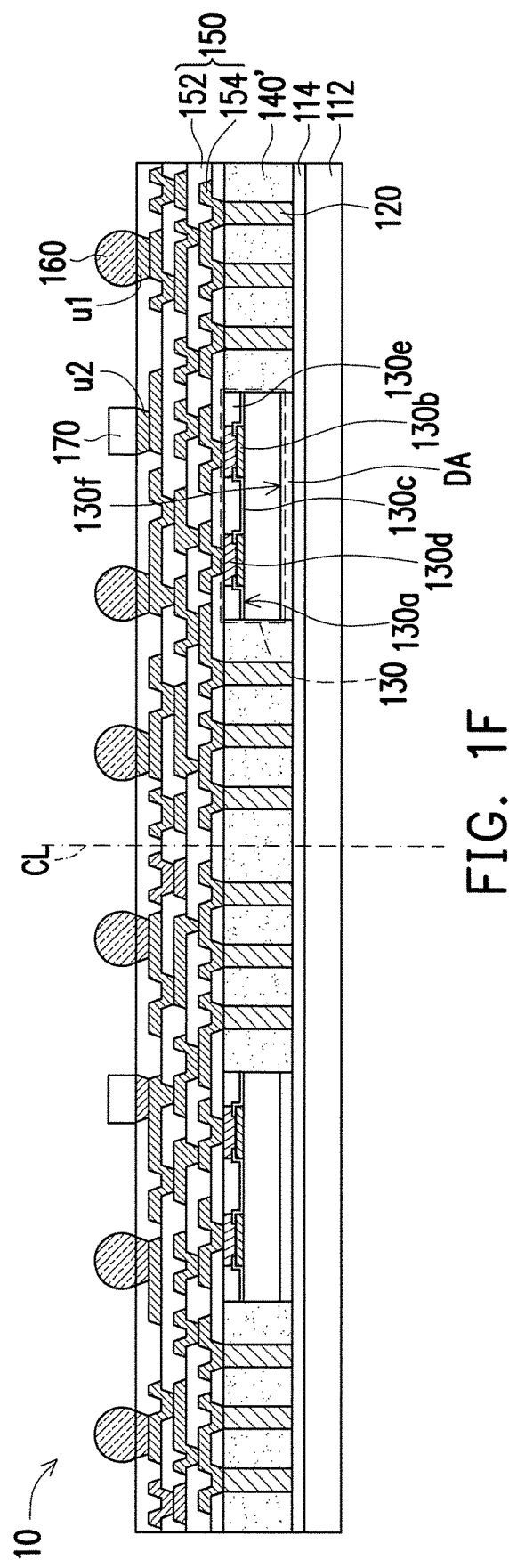

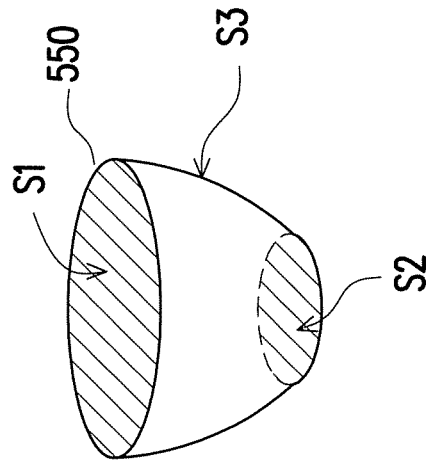
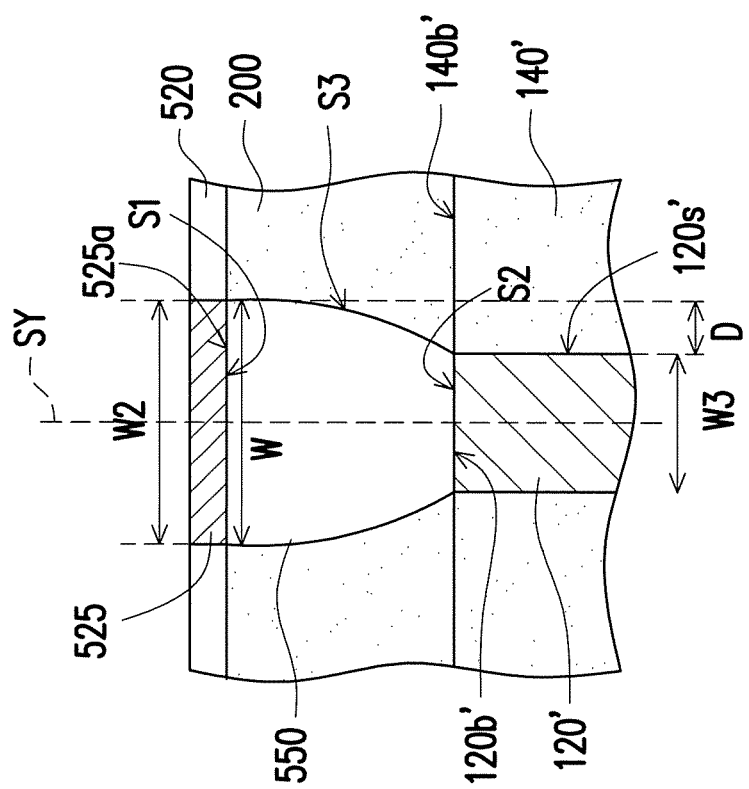
FIG. 3C
FIG. 3B

PACKAGE STRUCTURE AND MANUFACTURING METHOD THEREOF

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1L are schematic cross sectional views of various stages in a manufacturing method of a package structure according to some exemplary embodiments of the disclosure.

FIG. 3B is an enlarged, schematic cross-sectional view of the package structure depicted in FIG. 3A.

FIG. 3C is a schematic three-dimensional cutaway diagram illustrating a solder joint depicted in FIG. 3A.

DETAILED DESCRIPTION

Figure 1A:
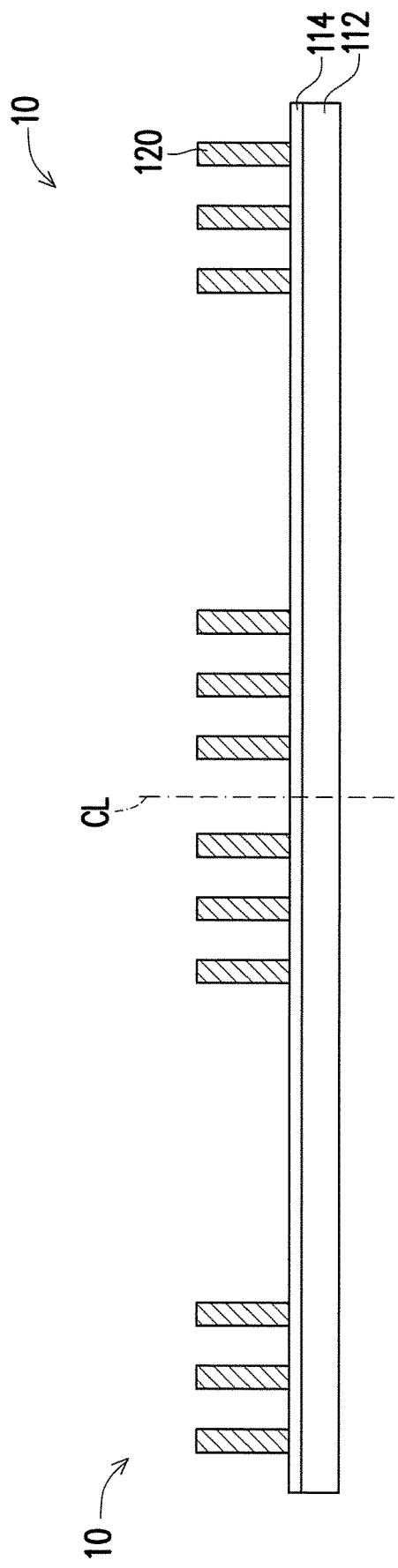

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross sectional views of various stages in a manufacturing method of a package structure according to some exemplary embodiments of the disclosure. In some embodiments, two semiconductor dies are shown to represent plural semiconductor dies of the wafer used to manufacture plural first packages 10, and a combination of a first package 10 and a second package 50 is shown to represent a Package-on-Package (PoP) structure PS1 obtained following the manufacturing method. In some embodiments, as shown in FIG. 1A to FIG. 1L, the dotted line represents a cutting line CL between any two of first packages 10.

Referring to FIG. 1A, in some embodiments, a carrier 112 is provided. In some embodiments, the carrier 112 may be a glass carrier or any suitable carrier for the manufacturing method of the first package 10. In some embodiments, the carrier 112 is coated with a debond layer 114. The material of the debond layer 114 may be any material suitable for bonding and debonding the carrier 112 from the above layer(s) (e.g., the debond layer 114) or any wafer(s) disposed thereon.

In some embodiments, the debond layer 114 may include a dielectric material layer made of a dielectric material including any suitable polymer-based dielectric material (such as benzocyclobutene ("BCB"), polybenzoxazole ("PBO")). In an alternative embodiment, the debond layer 114 may include a dielectric material layer made of an epoxy-based thermal-release material, which loses its adhesive property when heated, such as a light-to-heat-conversion (LTHC) release coating film. In a further alternative embodiment, the debond layer 114 may include a dielectric material layer made of an ultra-violet (UV) glue, which loses its adhesive property when exposed to UV lights. In certain embodiments, the debond layer 114 may be dispensed as a liquid and cured, or may be a laminate film laminated onto the carrier 112, or may be the like. The top surface of the debond layer 114, which is opposite to a bottom surface contacting the carrier 112, may be levelled and may have a high degree of coplanarity. In certain embodiments, the debond layer 114 is, for example, a LTHC layer with good chemical resistance, and such layer enables room temperature debonding from the carrier 112 by applying laser irradiation.

Continued on FIG. 1A, in some embodiments, one or more through insulator vias (TIVs) 120 are formed on the debond layer 114 and over the carrier 112. In some embodiments, the TIVs 120 are through integrated fan-out (InFO) vias. In certain embodiments, the TIVs 120 are located aside of a location of later-formed or later-provided die(s) and are arranged along but not on the cutting line CL. In some embodiments, the TIVs 120 are formed by photolithography, plating, photoresist stripping processes or any other suitable method. In one embodiment, the material of the TIVs 120 may include a metal material such as copper or copper alloys, or the like. The disclosure is not limited thereto.

In one embodiment, the TIVs 120 may be formed by forming a mask pattern having openings (not shown), where the mask pattern covers a portion of the debond layer 114 and exposes another portion of the debond layer 114 with the openings; forming a metallic material filling the openings to form the TIVs 120 by electroplating or deposition; and then removing the mask pattern. The material of the mask pattern may include a positive photo-resist or a negative photo-resist. However, the disclosure is not limited thereto.

In an alternative embodiment, the TIVs 120 may be formed by forming a seed layer (not shown) on the debond layer 114; forming the mask pattern with openings exposing portions of the seed layer; forming the metallic material on the exposed portions of the seed layer to form the TIVs 120 by plating; removing the mask pattern; and then removing portions of the seed layer exposed by the TIVs 120. For example, the seed layer may be a titanium/copper composited layer. For simplification, only six TIVs 120 are presented in one first package 10 depicted in FIG. 1A for illustrative purposes. However, it should be noted that less or more than six TIVs 120 may be formed; the disclosure is not limited thereto. The number of the TIVs can be selected based on the demand.

Figure 1B:
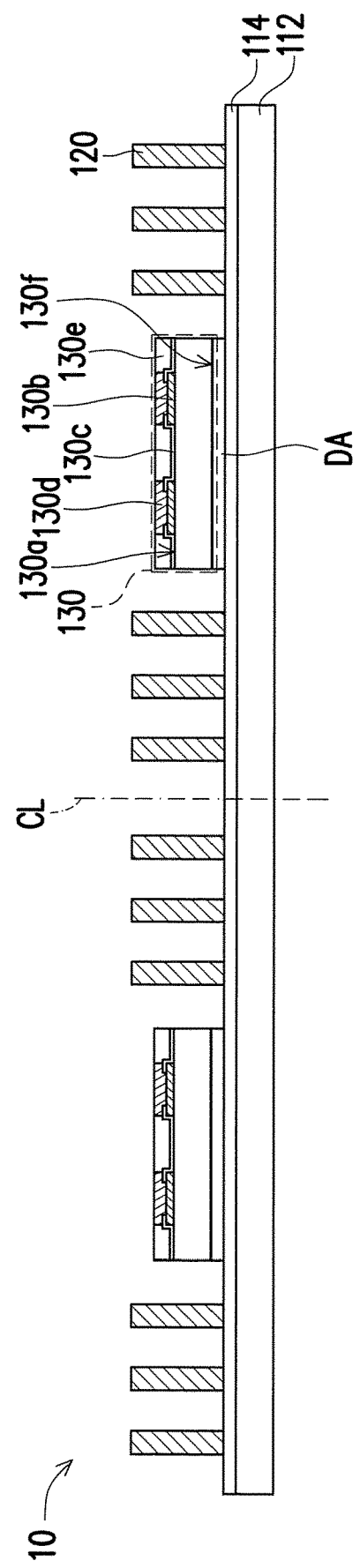

Referring to FIG. 1B, in some embodiments, at least one semiconductor die 130 is provided. In some embodiments, the semiconductor die 130 is disposed on the debond layer 114 and over the carrier 112 through a die attach film DA. In certain embodiments, the die attach film DA is first disposed on a backside 130f of the semiconductor die 130, then the semiconductor die 130 is attached to the debond layer 114 by placing the die attach film DA between the semiconductor die 130 and the debond layer 114. With the die attach film DA, a better adhesion between the semiconductor die 130 and the debond layer 114 is ensured. For example, in FIG. 1B, the backside 130f of the semiconductor die 130 is stably adhered to the debond layer 114 through the die attach film DA provided between the semiconductor die 130 and the debond layer 114.

In some embodiments, the semiconductor die 130 includes an active surface 130a, a plurality of pads 130b distributed on the active surface 130a, a passivation layer 130c covering the active surface 130a and a portion of the pad 130b, a plurality of conductive pillars 130d, a protection layer 130e, and the backside 130f opposite to the active surface 130a. The pads 130b are partially exposed by the passivation layer 130c, the conductive pillars 130d are disposed on and electrically connected to the pads 130b, and the protection layer 130e covers the passivation layer 130c and exposes the conductive pillars 130d, as shown in 1B. In some embodiments, the pads 130b may be aluminum pads or other suitable metal pads. In some embodiments, the conductive pillars 130d are copper pillars, copper alloy pillar or other suitable metal pillars, for example. In some embodiments, the passivation layer 130c and/or the protection layer 130e may be a polybenzoxazole (PBO) layer, a polyimide (PI) layer or other suitable polymers. In some alternative embodiments, the passivation layer 130c and/or the protection layer 130e may be made of inorganic materials, such as silicon oxide, silicon nitride, silicon oxynitride, or any suitable dielectric material. In certain embodiments, the materials of the passivation layer 130c and the protection layer 130e may be the same or different, the disclosure is not limited thereto. In an alternative embodiment, the semiconductor die 130 may include the active surface 130a, the pads 130b distributed on the active surface 130a, the passivation layer 130c covering the active surface 130a and a portion of the pad 130b, and the backside surface 130f opposite to the active surface 130a.

In some embodiments, the semiconductor die 130 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 1C:
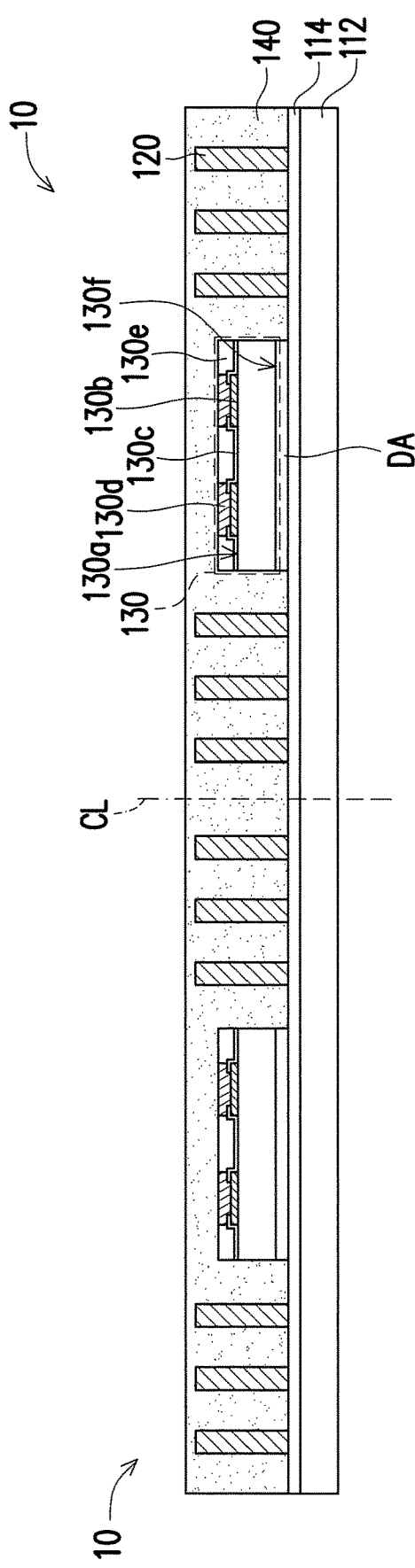

Referring to FIG. 1C, in some embodiments, the semiconductor die 130 and the TIVs 120 are encapsulated in the insulating encapsulation 140. In some embodiments, the insulating encapsulation 140 at least fills the gaps between the semiconductor die 130 and the TIVs 120 and the gaps between the TIVs 120. In some embodiments, the insulating encapsulation 140 is formed over the semiconductor die 130, the TIVs 120, and the debond layer 114. For example, as shown in FIG. 1C, the insulating encapsulation 140 covers the conductive pillars 130d and the protection layer 130e of the semiconductor die 130, the TIVs 120, and a surface of the debond layer 114 exposed by the TIVs 120 and the semiconductor die 130. In other words, a height of the insulating encapsulation 140 is greater than heights of the TIVs 120 and the semiconductor die 130, where the TIVs 120 and the semiconductor die 130 are not revealed by the insulating encapsulation 140.

In one embodiment, the material of the insulating encapsulation 140 includes epoxy resins, phenolic resins or silicon-containing resins, or any suitable materials, for example. In an alternative embodiment, the insulating encapsulation 140 may include any insulating encapsulation material that is able to be patterned by suitable patterning processes. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto.

Figure 1D:
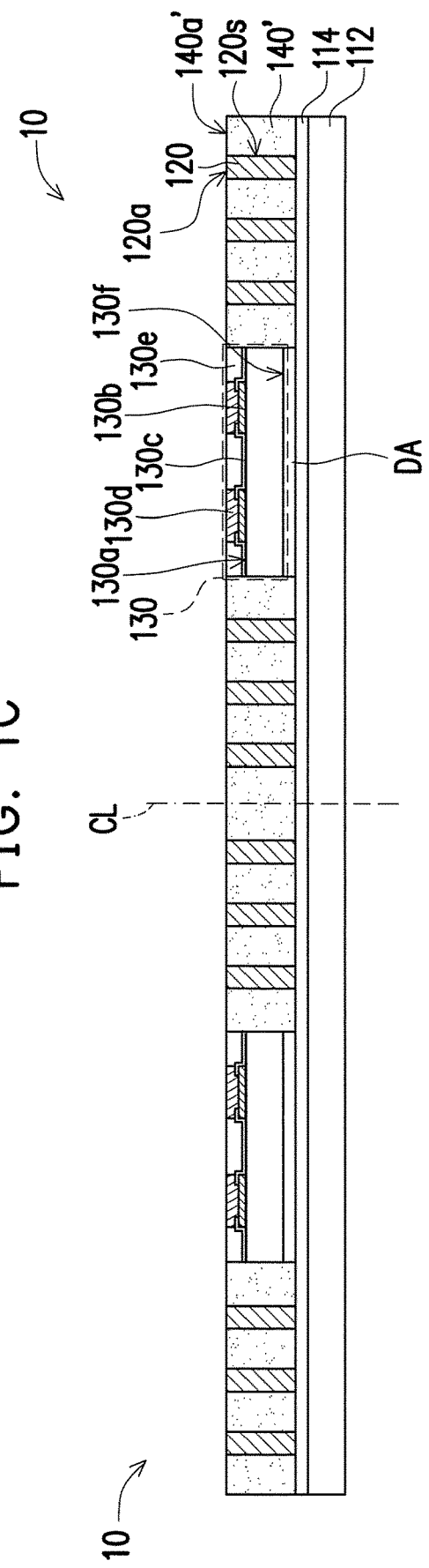

Referring to FIG. 1D, in some embodiments, the insulating encapsulation 140 is planarized to form a planarized insulating encapsulation 140' exposing the conductive pillars 130d and the protection layer 130e of the semiconductor die 130 and the TIVs 120. In some embodiments, the insulating encapsulation 140 and the TIVs 120 are planarized until top surfaces of the conductive pillars 130d and the protection layer 130e of the semiconductor die 130 and top surfaces 120a of the TIVs 120 are exposed. In certain embodiments, as shown in FIG. 1D, after the planarization, the top surfaces of the conductive pillars 130d and the protection layer 130e of the semiconductor die 130 and the top surfaces 120a of the TIVs 120 become substantially levelled with a top surface 140a' of the planarized insulating encapsulation 140'. In other words, the top surfaces of the conductive pillars 130d and the protection layer 130e and the top surfaces 120a of the TIVs 120 are coplanar with the top surface 140a' of the planarized insulating encapsulation 140'. In some embodiments, as shown in FIG. 1D, a sidewall 120s of each of the TIVs 120 is covered by the planarized insulating encapsulation 140'.

In some embodiments, the insulating encapsulation 140 and the TIVs 120 are planarized through a grinding process or a chemical mechanical polishing (CMP) process. After the grinding process, a cleaning step may be optionally performed, for example to clean and remove the residue generated from the grinding step. However, the disclosure is not limited thereto, and the planarizing step may be performed through any other suitable method. The disclosure is not limited thereto.

Referring to FIG. 1E, in some embodiments, a first redistribution layer 150 is formed on the top surfaces 120a of the TIVs 120, the top surface 140a' of the planarized insulating encapsulation 140', and the top surfaces of the conductive pillars 130d and the protection layer 130e of the semiconductor die 130. In some embodiments, the first redistribution layer 150 is electrically connected to the semiconductor die 130 via the conductive pillars 130d and the pads 130b, and the first redistribution layer 150 is also electrically connected to the TIVs 120. In certain embodiments, at least one of the TIVs 120 is electrically connected to the semiconductor die 130 through the first redistribution layer 150. As shown in FIG. 1E, the planarized insulating encapsulation 140' is located between the debond layer 114 and the first redistribution layer 150.

The formation of the first redistribution layer 150 includes sequentially forming one or more polymer dielectric layers 152 and one or more metallization layers 154 in alternation. In certain embodiments, as shown in FIG. 1E, the metallization layers 154 are sandwiched between the polymer dielectric layers 152, but the top surface of the topmost layer (away from the top surface 140a' of the planarized insulating encapsulation 140') of the metallization layers 154 is exposed and a bottom surface of the lowest layer (close to the top surface 140a' of the planarized insulating encapsulation 140') of the metallization layers 154 is exposed to be connected to the TIVs 120 and the conductive pillars 130d of the semiconductor die 130. In some embodiments, the material of the metallization layers 154 may include aluminum, titanium, copper, nickel, tungsten, and/or alloys thereof, and the metallization layers 154 may be formed by electroplating or deposition. In some embodiments, the material of the polymer dielectric layers 152 may include polyimide, epoxy resin, acrylic resin, phenol resin, benzocyclobutene (BCB), polybenzoxazole (PBO), or any other suitable polymer-based dielectric material, and the polymer dielectric layers 152 may be formed by deposition. The disclosure is not limited thereto.

Referring to FIG. 1F, conductive elements 160 and at least one semiconductor element 170 are disposed on the exposed top surface of the topmost layer of the metallization layers 154 of the first redistribution layer 150. In certain embodiments, the first redistribution layer 150 is located between the planarized insulating encapsulation 140' and the conductive elements 160 and between the planarized insulating encapsulation 140' and the semiconductor element 170. In one embodiment, the semiconductor element 170 is joined to the first redistribution layer 150 after the conductive elements 160 are disposed. In one embodiment, the semiconductor element 170 is joined to the first redistribution layer 150 before the conductive elements 160 are disposed.

In certain embodiments, the conductive elements 160 are, for example, solder balls or ball grid array (BGA) balls placed on the exposed top surface of the topmost layer of the metallization layers 154 of the first redistribution layer 150, and parts of the topmost metallization layer 154 underlying the conductive elements 160 function as UBM layers. In some embodiments, through the first redistribution layer 150, some of the conductive elements 160 are electrically connected to the semiconductor die 130. In some embodiments, through the first redistribution layer 150, some of the conductive elements 160 are electrically connected to the TIVs 120. In some embodiments, through the first redistribution layer 150, some of the conductive elements 160 are electrically connected to the semiconductor element 170.

In certain embodiments, the semiconductor element 170, for example, may include a passive semiconductor component or an active semiconductor component according to the product requirements, the disclosure is not limited thereto. In some embodiments, the semiconductor element 170 may include integrated passive components (IPDs) such as capacitors, resistors, inductors, and transducers, or the semiconductor element 170 may include a voltage regulator chip, a sensor chip, a memory chip or the like. In some embodiments, the semiconductor element 170 is connected to the first redistribution layer 150 through flip chip bonding technology or surface mount technology; the disclosure is not limited thereto. In some embodiments, through the first redistribution layer 150, the semiconductor element 170 may be electrically connected to the semiconductor die 130. In some embodiments, through the first redistribution layer 150, the semiconductor element 170 may be electrically connected to at least one of the TIVs 120. In some embodiments, through the first redistribution layer 150, the semiconductor element 170 may be electrically connected to the semiconductor die 130. In some embodiments, through the first redistribution layer 150, the semiconductor element 170 may be electrically connected to one or more the conductive elements 160.

In some embodiments, prior to disposing the conductive elements 160 and/or the semiconductor element 170, solder paste (not shown) or flux is applied on the exposed top surface of the topmost layer of the metallization layers 154 of the first redistribution layer 150, so that the conductive elements 160 and the semiconductor element 170 are better fixed to the exposed top surface of the topmost layer of the metallization layers 154. Continued on FIG. 1F, in some embodiments, a plurality of connecting pads u1 and/or u2 are formed on the exposed top surface of the topmost layer of the metallization layers 154 for electrically connecting the exposed top surface of the topmost layer of the metallization layers 154 with the conductive elements 160 and/or the semiconductor element 170, the disclosure is not limited thereto. In certain embodiments, the connecting pads u1 are located between the conductive elements 160 and the exposed top surface of the topmost layer of the metallization layers 154 for connecting the exposed top surface of the topmost layer of the metallization layers 154 and the conductive elements 160. On the other hand, in certain embodiments, the connecting pad u2 is located between the semiconductor element 170 and the exposed top surface of the topmost layer of the metallization layers 154 for connecting the exposed top surface of the topmost layer of the metallization layers 154 and the semiconductor element 170.

In one embodiment, as shown in FIG. 1F, the connecting pads u1 and u2 are solder mask defined (SMD) pads, for example. In an alternative embodiment, the connecting pads u1 and u2 may be under-ball metallurgy (UBM)-like pads. In an alternative embodiment, the connecting pads u1 and u2 may be non-solder mask defined (NSMD) pads. The disclosure is not limited thereto.

Figure 1G:
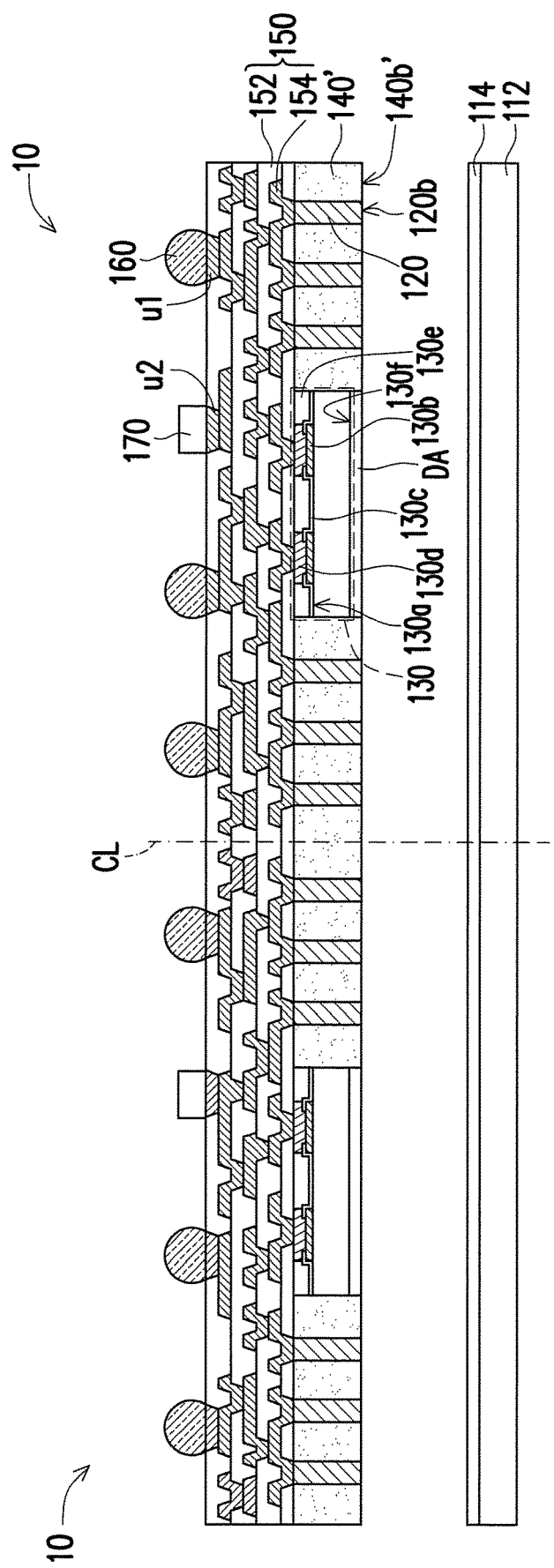

Referring to FIG. 1G, in some embodiments, the carrier 112 is debonded from the die attach film DA, the TIVs 120, and the planarized insulating encapsulation 140'. In some embodiments, the first package 10 is easily separated from the die attach film DA, the TIVs 120 and the planarized insulating encapsulation 140' due to the debond layer 114. As shown in FIG. 1G, a surface of the die attach film DA, bottom surfaces 120b of the TIVs 120 and a bottom surface 140b' of the planarized insulating encapsulation 140' are exposed, for example. In certain embodiments, the bottom surfaces 120b of the TIVs 120 and the bottom surface 140b' of the planarized insulating encapsulation 140' are substantially levelled with and coplanar to each other.

Figure 1H:
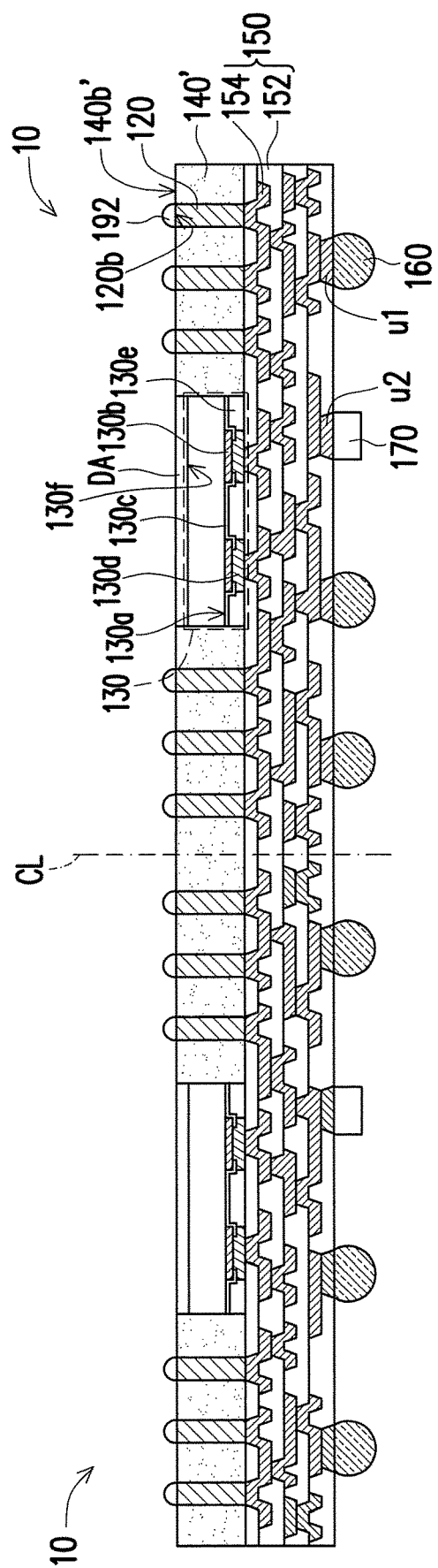

Referring to FIG. 1H, in some embodiments, the first package 10 is flipped (e.g. turned upside down), and pre-solders 192 are formed on the bottom surfaces 120b of the TIVs 120 exposed by the bottom surface 140b' of the planarized insulating encapsulation 140'. In some embodiments, the pre-solders 192 are pre-solder pastes, for example. In an alternative embodiment, the pre-solders 192 may be pre-solder blocks. In some embodiments, the material of the pre-solders 192 may include a lead-free solder material (such as Sn—Ag base or Sn—Ag—Cu base materials) with or without additional impurity (such as Ni, Bi, Sb, Au, or the like). The disclosure is not limited thereto.

Figure 1I:
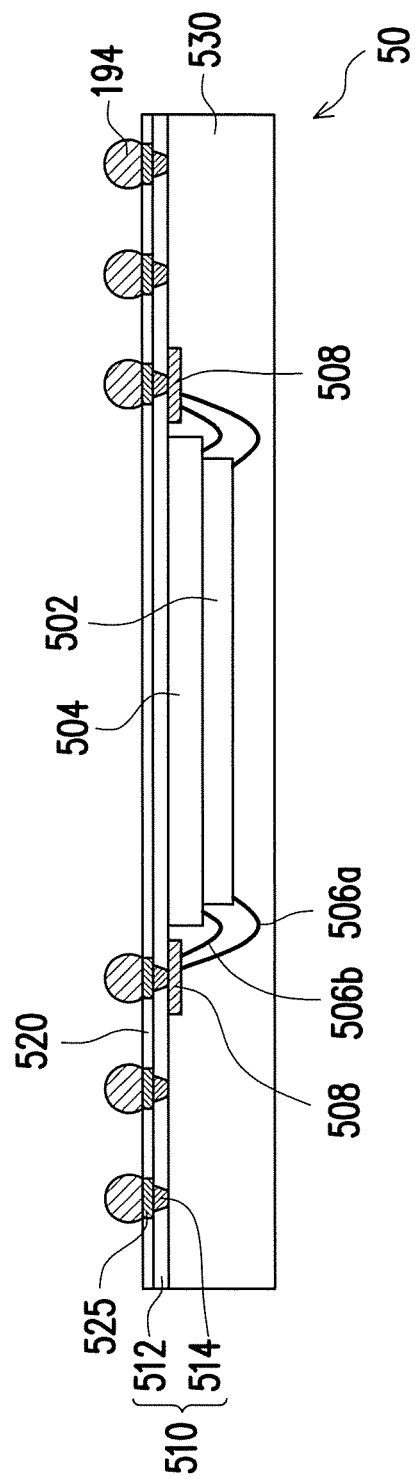

Referring to FIG. 1I, in some embodiments, at least one second package 50 is provided. In some embodiments, the second package 50 includes a semiconductor die 502, a semiconductor die 504, wirings 506a, 506b, contact pads 508, a second redistribution layer 510, a solder mask layer 520, conductive pads 525, and an insulating encapsulation 530. In some embodiments, the semiconductor die 504 is stacked on the semiconductor die 502. In certain embodiments, the semiconductor die 502 is electrically connected to the second redistribution layer 510 through the wirings 506a and the contact pads 508, while the semiconductor die 504 is electrically connected to the second redistribution layer 510 through the wirings 506b and the contact pads 508. The semiconductor die 502, the semiconductor die 504, the wirings 506a, 505b, and the contact pads 508 are encapsulated in the insulating encapsulation 530. In certain embodiments, the semiconductor dies 502, 504 may be the memory devices, where may include dynamic random access memories (DRAM), but the disclosure is not limited thereto. In some embodiments, the material of the contact pads 508 may include as copper or copper alloys, or the like. In some embodiments, the material of the insulating encapsulation 530 may be the same or different from the material of the planarized insulating encapsulation 140' (or saying the insulating encapsulation 140).

Continued on FIG. 1I, in some embodiments, the second redistribution layer 510 having one or more metallization layers and one or more polymer dielectric layers arranged in alternation is disposed on the insulating encapsulation 530. In some embodiments, as shown in FIG. 1I, the second redistribution layer 510 includes one polymer dielectric layer 512 and one metallization layer 514; however, the disclosure is not limited thereto. The numbers of the metallization layers and the polymer dielectric layers included in the second redistribution layer 510 is not limited according to the disclosure. In some embodiments, the solder mask layer 520 having openings (not marked) is located on the second redistribution layer 510, where the openings correspond to portions of the exposed top surface of the metallization layer 514 of the second redistribution layer 510 by the polymer dielectric layer 512, respectively. As shown in FIG. 1I, the conductive pads 525 are respectively disposed in the openings and connected to the exposed top surface of the metallization layer 514 of the second redistribution layer 510. In some embodiments, some of the conductive pads 525 are electrically connected to at least one of the semiconductor die 502 and the semiconductor die 504 through the second redistribution layer 510 and the contact pads 508. In some embodiments, the second redistribution layer 510 is located between the insulating encapsulation 530 and the solder mask layer 520 and between the insulating encapsulation 530 and the conductive pads 525. For example, the conductive pads 525 are SMD pads. In an alternative embodiment, the conductive pads 525 may be UBM-like pads or NSMD pads, the disclosure is not limited thereto.

In some embodiments, as shown in FIG. 1I, solder elements 194 are formed on the conductive pads 525 for electrically connecting the second redistribution layer 510. In one embodiment, the solder elements 194 are BGA balls, solder bumps or solder blocks, the disclosure is not limited thereto. In some embodiments, the material of the solder elements 194 may include a lead-free solder material (such as Sn—Ag base or Sn—Ag—Cu base materials) with or without additional impurity (such as Ni, Bi, Sb, Au, or the like.). In one embodiment, the materials of the solder elements 194 and the pre-solders 192 are the same. However, the disclosure is not limited thereto; in an alternative embodiment, the material of the solder elements 194 is different from the material of the pre-solders 192.

Figure 1J:
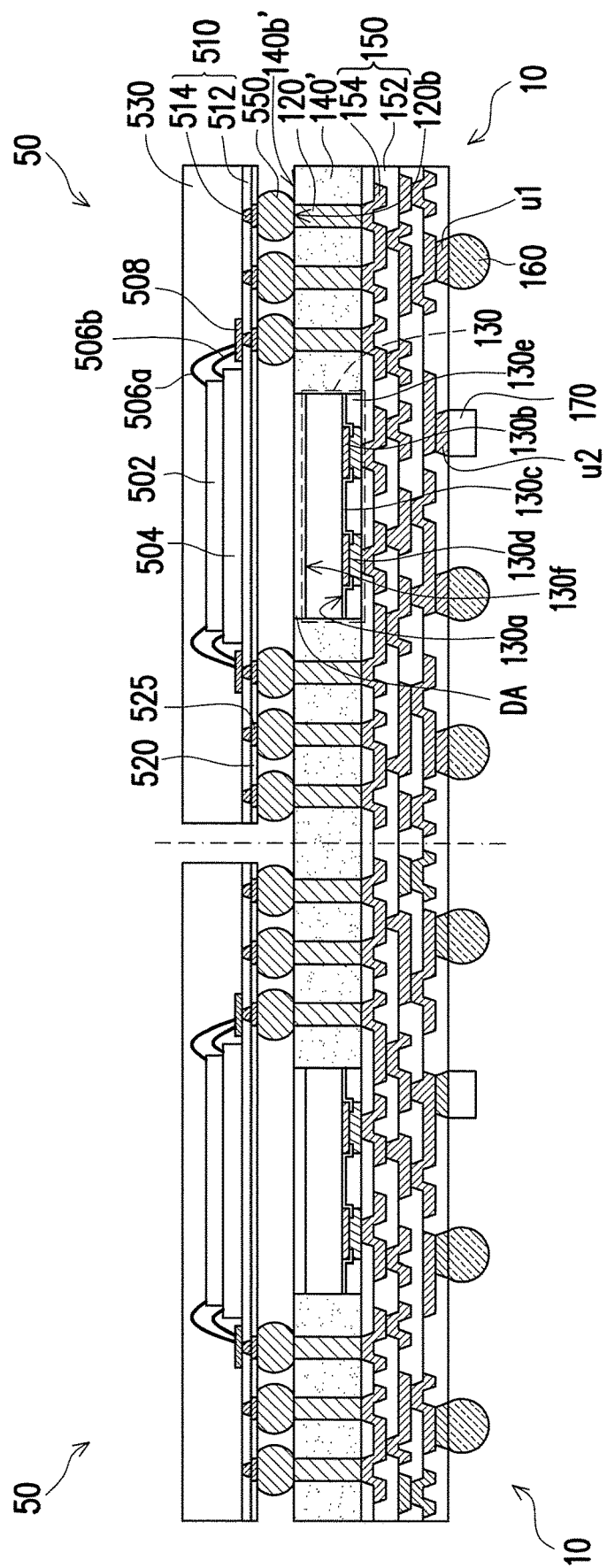

Referring to FIG. 1J, in some embodiments, the second package 50 is mounted onto the first package 10 by connecting the solder elements 194 and the pre-solders 192, and solder joints 550 are formed between the first package 10 and the second package 50. In certain embodiments, the first package 10 and the second package 50 are electrically connected through the solder joints 550. In some embodiments, a reflow process is preformed to physically connect the solder elements 194 and the pre-solders 192 so as to form the solder joints 550. In some embodiments, at least one of the semiconductor die 502 and the semiconductor die 504 is electrically connected to the semiconductor die 130, the conductive elements 160 and/or the semiconductor element 170 through the wirings 506a/506b, the contact pads 508, the second redistribution layer 510, the solder joints 550, the TIVs 120 and the first redistribution layer 150.

Figure 1K:
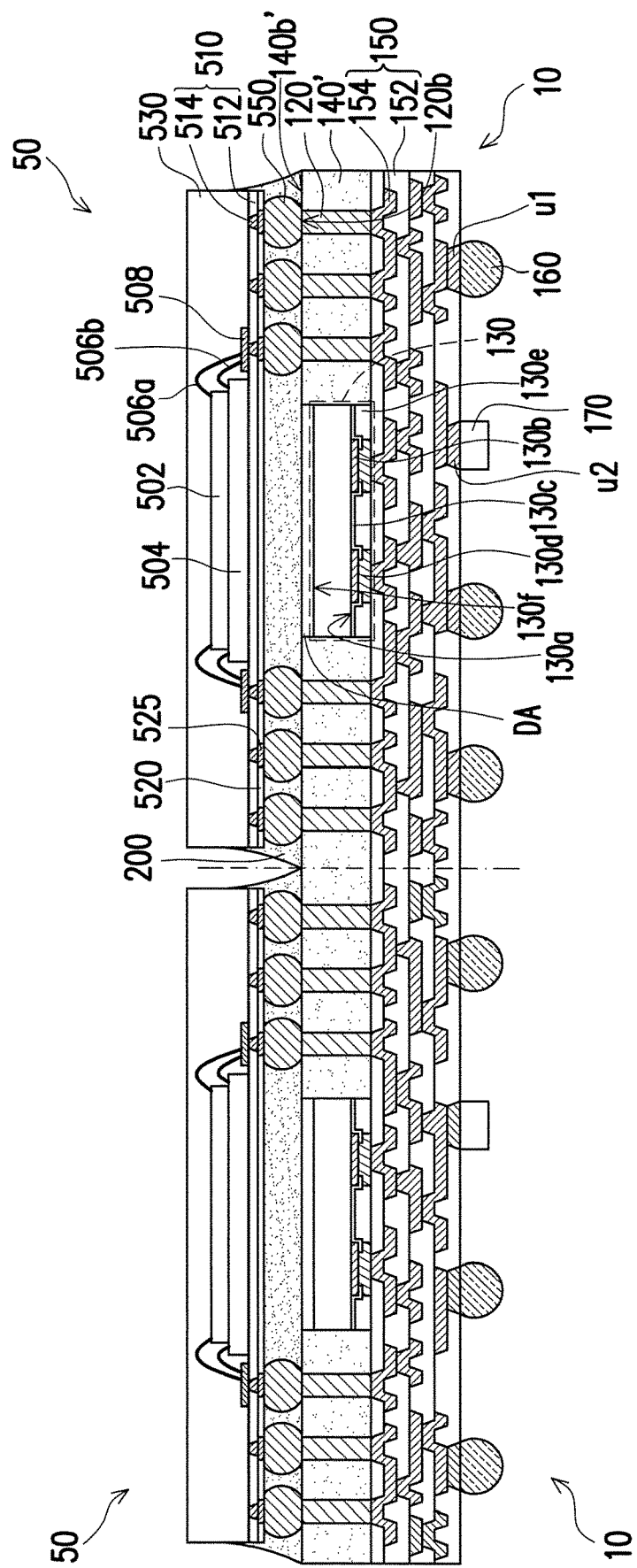

Referring to FIG. 1K, in some embodiments, an underfill material 200 is filled between the second package 50 and the first package 10. In certain embodiments, the underfill material 200 at least fills the gaps between the solder mask layer 520 of the second package 50, the solder joints 550 and the planarized insulating encapsulation 140' of the first package 10. As shown in FIG. 1K, for example, the underfill material 200 covers and is in contact with the solder mask layer 520 of the second package 50, the solder joints 550 and the planarized insulating encapsulation 140' of the first package 10. In one embodiment, the underfill material 200 may be formed by underfill dispensing or any other suitable method. In some embodiments, a material of the underfill material 200 and the planarized insulating encapsulation 140' (or saying the insulating encapsulation 140) may be the same or different, the disclosure is not limited thereto.

Figure 1L:
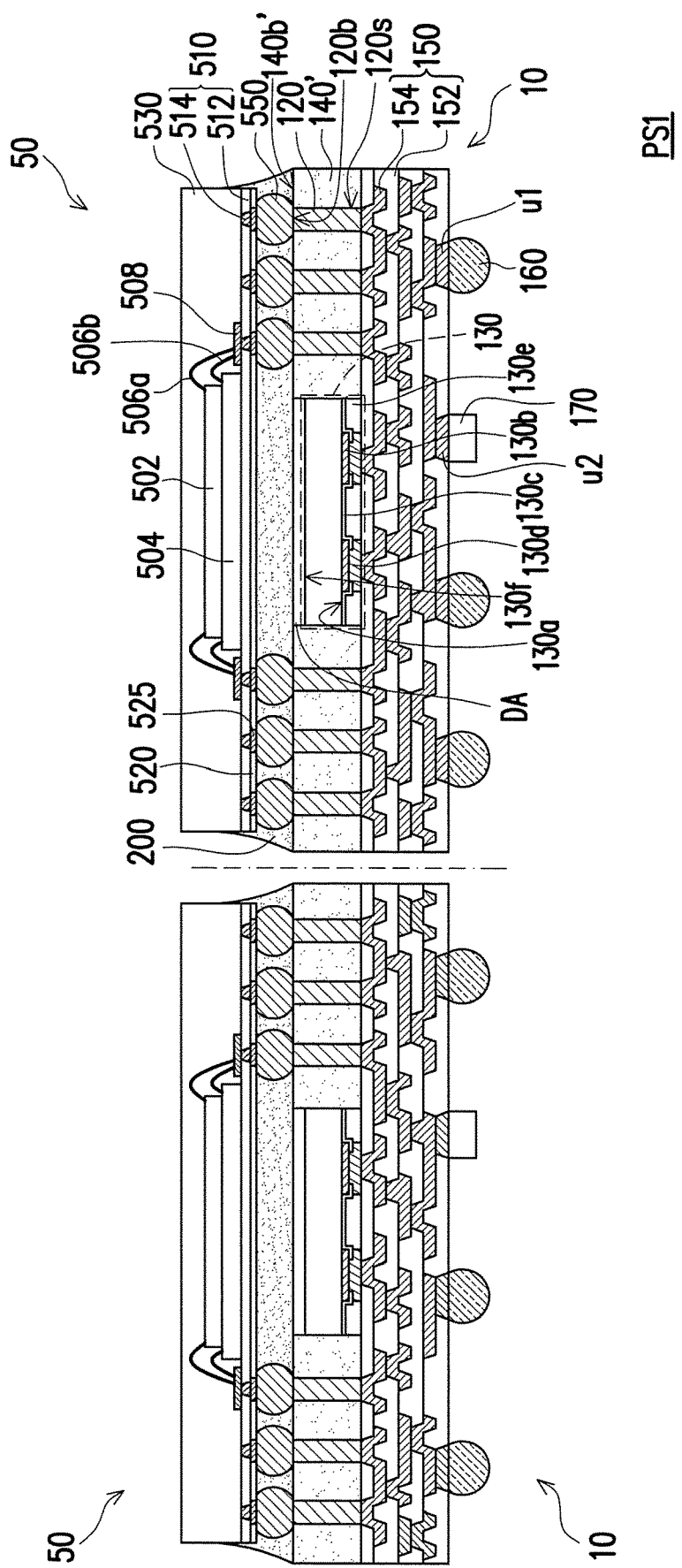

Referring to FIG. 1L, in some embodiments, a singulation (dicing) process is performed to cut though at least the underfill material 200, the planarized insulating encapsulation 140' and the first redistribution layer 150 along the cutting line CL (indicated by the dotted line) so as to form individual and separate PoP structures PS1. In one embodiment, the singulation (dicing) process is a wafer dicing process including mechanical sawing or laser cutting. Up to here, the manufacture of the PoP structure PS1 is completed.

Figure 2A:
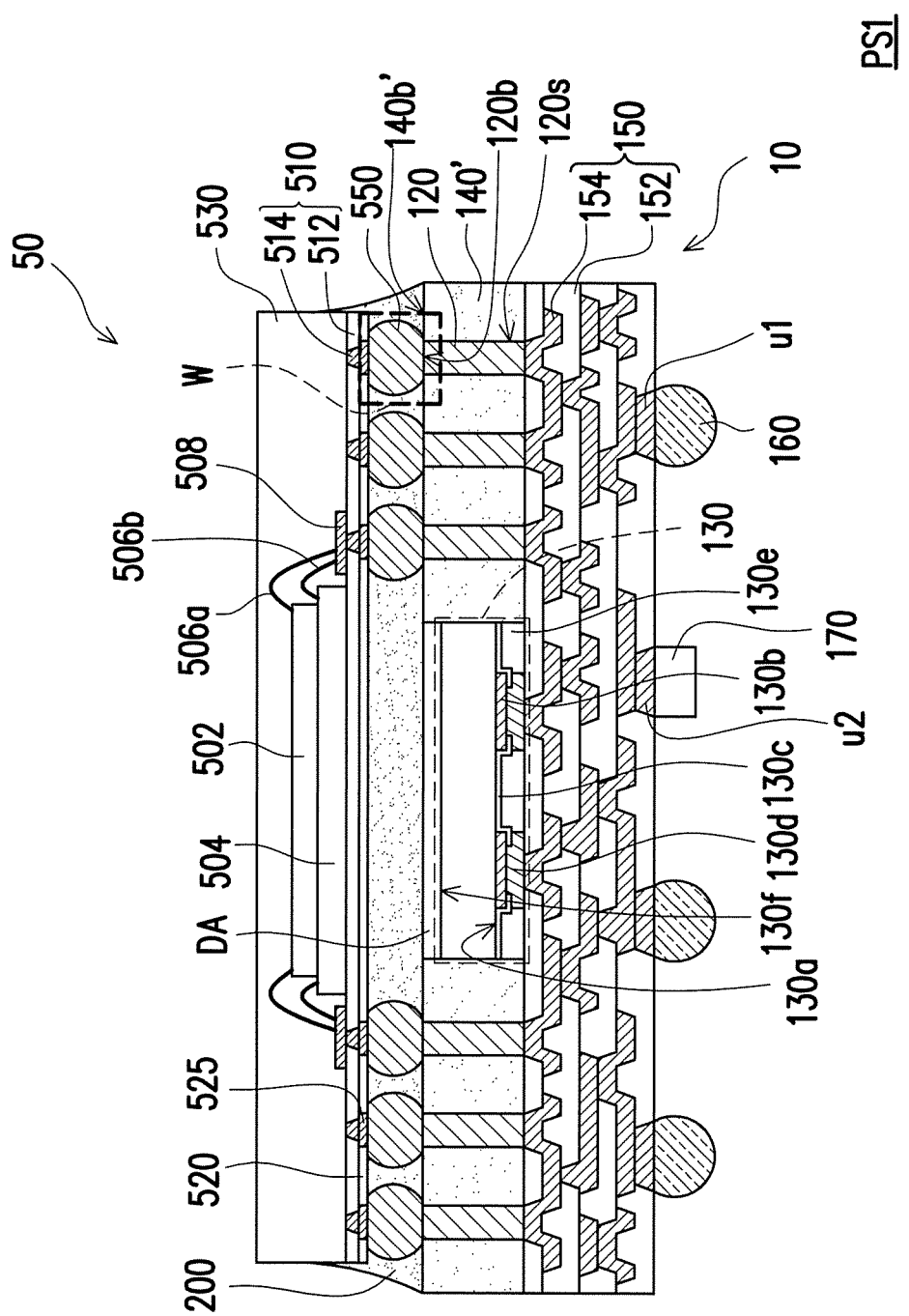
FIG. 2A is a schematic cross sectional view of a package structure according to some exemplary embodiments of the disclosure.
Figure 2C:
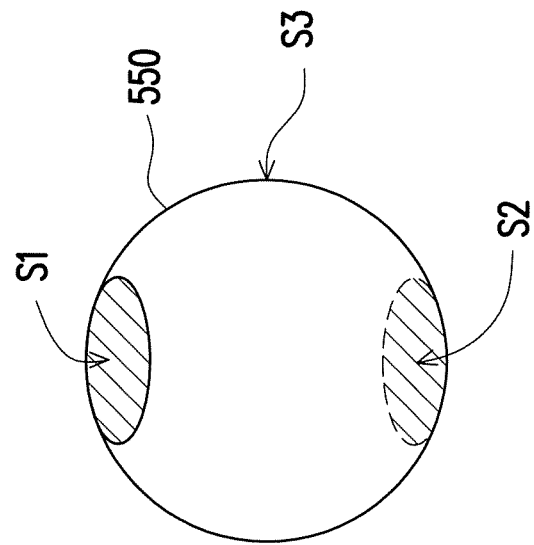
FIG. 2C is a schematic three-dimensional cutaway diagram illustrating a solder joint depicted in FIG. 2A.
Figure 2B:
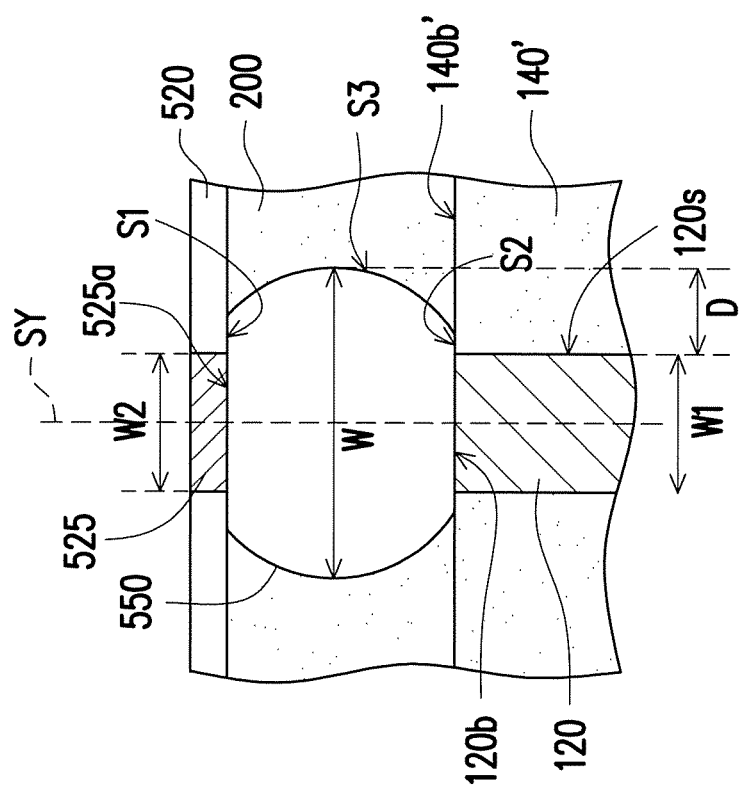
FIG. 2B is an enlarged, schematic cross-sectional view of the package structure depicted in FIG. 2A.

FIG. 2A is a schematic cross sectional view of a package structure according to some exemplary embodiments of the disclosure. FIG. 2B is an enlarged, schematic cross-sectional view of the package structure depicted in FIG. 2A, where FIG. 2B shows an enlarged region indicated with a dotted box W depicted in FIG. 2A. FIG. 2C is a schematic three-dimensional cutaway diagram illustrating a solder joint depicted in FIG. 2A. The PoP structure PS1 of FIG. 2A may be fabricated following the previously described manufacturing process as described in FIG. 1A-1L. In some embodiments, the PoP structure PS1 includes the first package 10, the second package 50, the solder joints 550 electrically connecting and located between the first package 10 and the second package 50, and the underfill material 200 located between the first package 10 and the second package 50 and encapsulating the solder joints 550.

Referring to FIG. 2A, the first package 10 includes the TIVs 120, the semiconductor die 130, the planarized insulating encapsulation 140', the first redistribution layer 150, the conductive elements 160, the semiconductor element 170, and the connecting pads u1, u2. In some embodiments, the TIVs 120 and the semiconductor die 130 are encapsulated in the planarized insulating encapsulation 140'. In some embodiments, the first redistribution layer 150 is located on the planarized insulating encapsulation 140' and is electrically connected to the TIVs 120 and the conductive pillars 130d of the semiconductor die 130. In some embodiments, the conductive elements 160 and the semiconductor element 170 are electrically connected to the first redistribution layer 150 through the connecting pads u1 and the connecting pad u2, respectively. In some embodiments, the first redistribution layer 150 is located between the connecting pads u1 and the planarized insulating encapsulation 140' and between the connecting pad u2 and the planarized insulating encapsulation 140'.

Continued on FIG. 2A, the second package 50 includes the semiconductor die 502, the semiconductor die 504, the wirings 506a, 506b, the contact pads 508, the second redistribution layer 510, the solder mask layer 520, the conductive pads 525, and the insulating encapsulation 530. In some embodiments, the semiconductor die 502 and the semiconductor die 504 are stacked and are respectively connected to the contact pads 508 through the wirings 506a and 506b. In some embodiments, the semiconductor dies 502, the semiconductor die 504, the wirings 506a, 506b, and the contact pads 508 are encapsulated in the insulating encapsulation 530. In some embodiments, the second redistribution layer 510 is located on the insulating encapsulation 530 and is physically connected to the contact pads 508. In some embodiments, the solder mask layer 520 and the conductive pads 525 are located on the second redistribution layer 510, where the second redistribution layer 510 is located between the solder mask layer 520 and the insulating encapsulation 530 and between the conductive pads 525 and the insulating encapsulation 530. In some embodiments, the conductive pads 525 are electrically connected to at least one of the semiconductor die 502 and the semiconductor die 504 through the second redistribution layer 510, the contact pads 508, and the corresponding one of the wirings 506a, 506b.

In some embodiments, the solder joints 550 are located between the first package 10 and the second package 50, where the first package 10 and the second package 50 are electrically connected through the solder joints 550. In some embodiments, as shown in FIG. 2A, the solder joints 550 physically contacts the TIVs 120, the planarized insulating encapsulation 140', the conductive pads 525, and the solder mask layer 520.

Referring to FIG. 2B to FIG. 2C, certain structural features including the solder mask layer 520 and the conductive pad 525 of the second package 50, the TIV 120 and the planarized insulating encapsulation 140' of the first package 10, the solder joint 550 and the underfill material 200 located therebetween are stressed for illustration purposes, and only one TIV 120, one conductive pad 525 and one solder joint 550 are shown in FIG. 2B for easy illustration. In some embodiments, the solder joint 550 is located between the conductive pad 525 and the TIV 120 for electrical connection of two packages (e.g., the first package 10 and the second package 50). In some embodiments, the solder joint 550 is further located between the solder mask layer 520 and the planarized insulating encapsulation 140'.

In some embodiments, as shown in FIG. 2B and FIG. 2C, the solder joint 550 has a first contact surface S1, a second contact surface S2 opposite to the first contact surface S1, and a side surface S3 connecting the first contact surface S1 and the second contact surface S2. In some embodiments, the first contact surface S1 of the solder joint 550 is in contact with a top surface 525a of the conductive pad 525, and the second contact surface S2 of the solder joint 550 is in contact with the bottom surface 120b of the TIV 120, as shown in FIG. 2B. In certain embodiments, the side surface S3 of the solder joint 550 is covered by and in physical contact with the underfill material 200 as shown in FIG. 2B. In some embodiments, the first contact surface S1 and the second contact surface S2 are planes. In certain embodiments, as shown in FIG. 2C, the solder joint 550 is a round ball with two truncated ends, where an area of the first contact surface S1 is substantially equal to an area of the second contact surface S2, for example.

In some embodiments, as shown in FIG. 2B, along a horizontal direction that is substantially parallel to the bottom surface 140b' of the planarized insulating encapsulation 140', a maximum size W of the solder joint 550 is greater than a maximum size W1 of the TIV 120 and is greater than a maximum size W2 of the conductive pad 525, and the maximum size W2 of the conductive pad 525 is substantially equal to the maximum size W1 of the TIV 120. In some embodiments, a ratio of the maximum size W of the solder joints 550 to the maximum size W1 of the TIVs 120 is greater than or substantially equal to 1.1 and less than or substantially equal to 1.6. In some embodiments, a ratio of the maximum size W of the solder joints 550 to the maximum size W2 of the conductive pads 525 is greater than or substantially equal to 1.1 and less than or substantially equal to 1.6. In some embodiments, as shown in FIG. 2B, along a direction perpendicular to the central line SY of the solder joint 550, a maximum distance D between the sidewall 120s of the TIV 120 and the side surface S3 of the solder joint 550 is in a range of about 50 μm to about 100 μm, approximately.

In some embodiments, as shown in FIG. 2B, in a vertical cross-section of the solder joint 550, the side surface S3 of the solder joint 550 is a curved surface (e.g. a convex curved surface) relative to a central line SY of the solder joint 550, where the vertical cross-section of the solder joint 550 is taken along a vertical plane perpendicular to the bottom surface 140b' of the planarized insulating encapsulation 140', and the vertical plane perpendicular to the bottom surface 140b' of the planarized insulating encapsulation 140' simultaneously passes through the TIVs 120, the planarized insulating encapsulation 140', solder mask layer 520, the conductive pads 525, the solder joint 550, and the underfill material 200. In some embodiments, along the vertical plane perpendicular to the bottom surface 140b' of the planarized insulating encapsulation 140', a ratio of a cross-sectional area of the solder joints 550 to a cross-sectional area of the TIVs 120 is greater than or substantially equal to 1 and less than or substantially equal to 1.5. In some embodiments, along the vertical plane, a ratio of the cross-sectional area of the solder joints 550 to a cross-sectional area of the conductive pads 525 is greater than or substantially equal to 1 and less than or substantially equal to 1.5. In other words, along the direction of the central line SY (from the bottom surface 140b' of the planarized insulating encapsulation 140' to the top surface 525a of the conductive pad 525, or vice versa), a lateral distance between the side surface S3 of the solder joint 550 and the central line SY is increased and then decreased, where the lateral distance is a distance taken along a direction perpendicular to the central line SY. As shown in FIG. 2B, an interface of the vertical cross-section of the solder joint 550 and the underfill material 200 is a non-planar surface (e.g., a curved surface) and an interface of the vertical cross-section of the TIV 120 and the planarized insulating encapsulation 140' is a planar surface (e.g., a flat surface), such that the interface between the solder joint 550 and the underfill material 200 in the vertical cross-section and the interface between the TIV 120 and the planarized insulating encapsulation 140' in the vertical cross-section are not aligned as straight lines. Due to the misalignment of the interfaces, a delamination at the interface of the TIV 120 and the planarized insulating encapsulation 140' caused by a stress coming from the interface of the side surface S3 of the solder joint 550 and the underfill material 200 can be suppressed, thereby achieving a better electrical performance.

Figure 3A:
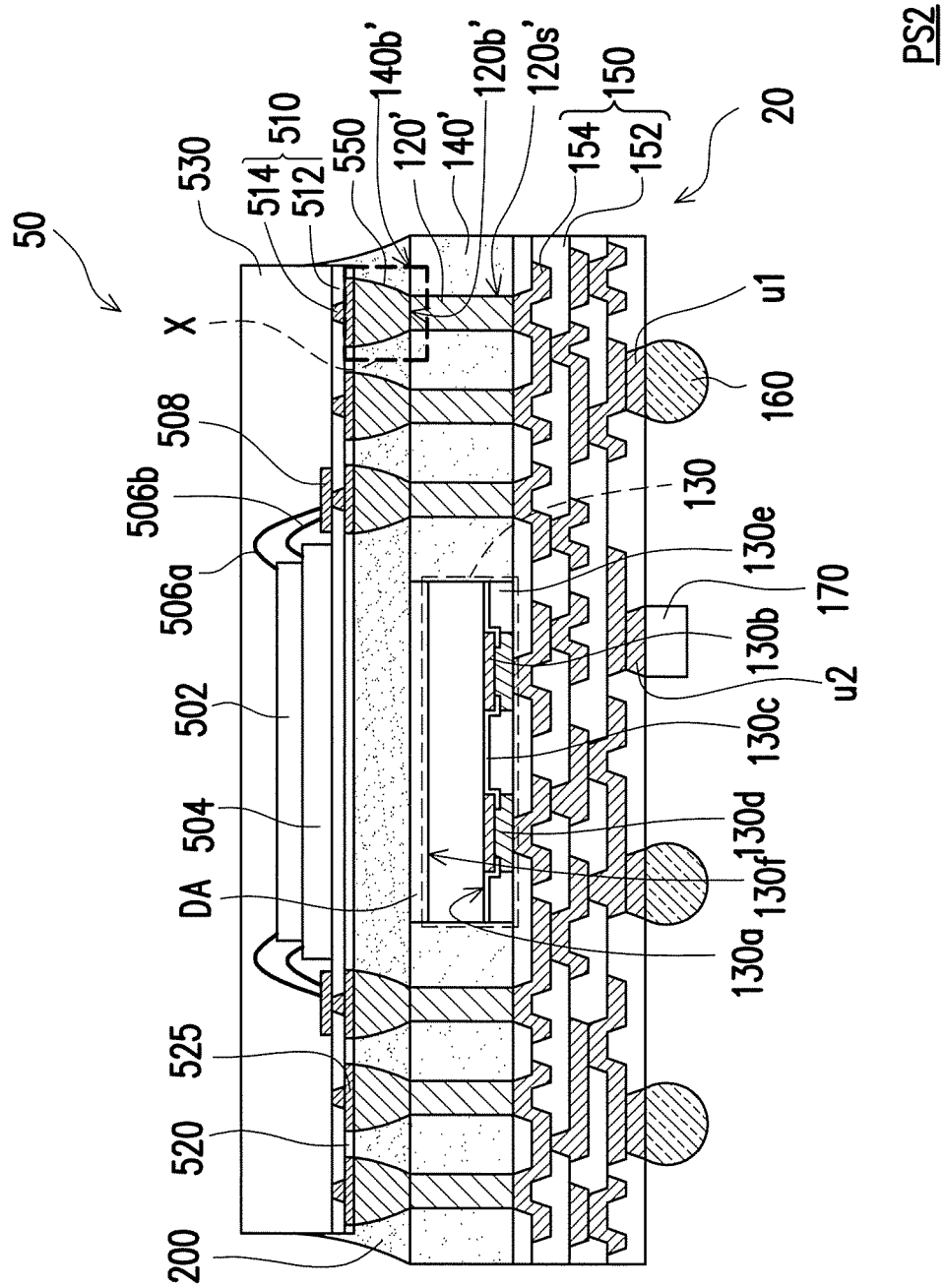
FIG. 3A is a schematic cross sectional view of a package structure according to some exemplary embodiments of the disclosure.

FIG. 3A is a schematic cross sectional view of a package structure according to some exemplary embodiments of the disclosure. FIG. 3B is an enlarged, schematic cross-sectional view of the package structure depicted in FIG. 3A, where FIG. 3B shows an enlarged region indicated with a dotted box X depicted in FIG. 3A. FIG. 3C is a schematic three-dimensional cutaway diagram illustrating a solder joint depicted in FIG. 3A. The PoP structure PS2 of FIG. 3A may be fabricated following the previously described manufacturing process as described in FIG. 1A-1L. The PoP structure PS1 depicted in FIG. 2A and the PoP structure PS2 depicted in FIG. 3A are similar, and thus the elements depicted in FIG. 3A that are similar to or substantially the same as the elements described above in FIG. 2A will use the same reference numbers, and certain details or descriptions of the same elements will not be repeated herein, for simplicity. Similarly, the elements depicted in FIG. 3B and FIG. 3C similar to or substantially the same as the elements described above in FIGS. 2B and 2C will use the same reference numbers, and certain details or descriptions of the same elements will not be repeated herein.

In some embodiments, the PoP structure PS2 includes the first package 20, the second package 50, the solder joints 550 electrically connecting and located between the first package 20 and the second package 50, and the underfill material 200 located between the first package 20 and the second package 50 and encapsulating the solder joints 550. Referring to FIG. 2A and FIG. 3A together, the PoP structure PS2 depicted in FIG. 3A has substituted the first package 10 with the first package 20, where the difference is that, in the first package 20 depicted in FIG. 3A, the TIVs 120' have a maximum size W3 less than the maximum size W1 along the horizontal direction substantially parallel to the bottom surface 140b' of the planarized insulating encapsulation 140'. In other words, the TIVs 120' depicted in the FIG. 3A and FIG. 3B are considered as thin through insulator vias as comparing with the TIVs 120 depicted in the FIG. 2A and FIG. 2B. With such configuration, in certain embodiments, the process step illustrated in FIG. 1H may be optionally omitted.

In certain embodiments, as shown in FIG. 3B, along the horizontal direction substantially parallel to the bottom surface 140b' of the planarized insulating encapsulation 140', the maximum size W of the solder joint 550 is greater than the maximum size W3 of the TIV 120' and is greater than the maximum size W2 of the conductive pad 525, and the maximum size W2 of the conductive pad 525 is greater than the maximum size W3 of the TIV 120'. In some embodiments, a ratio of the maximum size W of the solder joints 550 to the maximum size W3 of the TIVs 120' is greater than or substantially equal to 1.1 and less than or substantially equal to 2. In some embodiments, a ratio of the maximum size W of the solder joints 550 to the maximum size W2 of the conductive pads 525 is greater than or substantially equal to 1.1 and less than or substantially equal to 1.6. In some embodiments, a ratio of the maximum size W3 of the TIVs 120' to the maximum size W2 of the conductive pads 525 is greater than or substantially equal to 0.5 and less than 1. In some embodiments, along the horizontal direction, a ratio of the cross-sectional area of the solder joints 550 to the cross-sectional area of the TIVs 120' is greater than or substantially equal to 1 and less than or substantially equal to 1.5. In some embodiments, a ratio of the cross-sectional area of the solder joints 550 to the cross-sectional area of the conductive pads 525 is greater than or substantially equal to 1 and less than or substantially equal to 1.5.

In some embodiments, as shown in FIG. 3B and FIG. 3C, the solder joint 550 has a first contact surface S1, a second contact surface S2 opposite to the first contact surface S1, and a side surface S3 connecting the first contact surface S1 and the second contact surface S2. In certain embodiments, as shown in FIG. 3B, along the direction perpendicular to the central line SY of the solder joint 550, a maximum distance D between the sidewall 120s' of the TIV 120' and the side surface S3 of the solder joint 550 is in a range of about 50 μm to about 100 μm, approximately. In some embodiments, as shown in FIG. 3C, the solder joint 550 is a round ball with two truncated ends, where an area of the first contact surface S1 is greater than an area of the second contact surface S2. In other words, the first contact surface S1 and the second contact surface S2 are planes, and the side surface S3 is a curved surface.

Referring to FIG. 3B, in some embodiments, along the direction of the central line SY from the bottom surface 120b' of the TIV 120' to the top surface 525a of the conductive pad 525, the lateral distance between the side surface S3 of the solder joint 550 and the central line SY is increased. In FIG. 3B, for example, the interface of the vertical cross-section of the solder joint 550 and the underfill material 200 is a non-planar surface (e.g. a curved surface) and the interface of the vertical cross-section of the TIV 120' and the planarized insulating encapsulation 140' is a planar surface (e.g. a flat surface), such that the interface between the solder joint 550 and the underfill material 200 in the vertical cross-section and the interface between the TIV 120' and the planarized insulating encapsulation 140' in the vertical cross-section are not aligned as straight lines. Due to the misalignment of the interfaces, a delamination at the interface of the TIV 120' and the planarized insulating encapsulation 140' caused by a stress coming from the interface of the side surface S3 of the solder joint 550 and the underfill material 200 can be suppressed, thereby achieving a better electrical performance.

FIG. 4A to FIG. 4E are schematic cross sectional views of various stages in a manufacturing method of a package structure according to some exemplary embodiments of the disclosure. The elements similar to or substantially the same as the elements described previously will use the same reference numbers, and certain details or descriptions of the same elements may not be repeated herein.

Figure 4A:
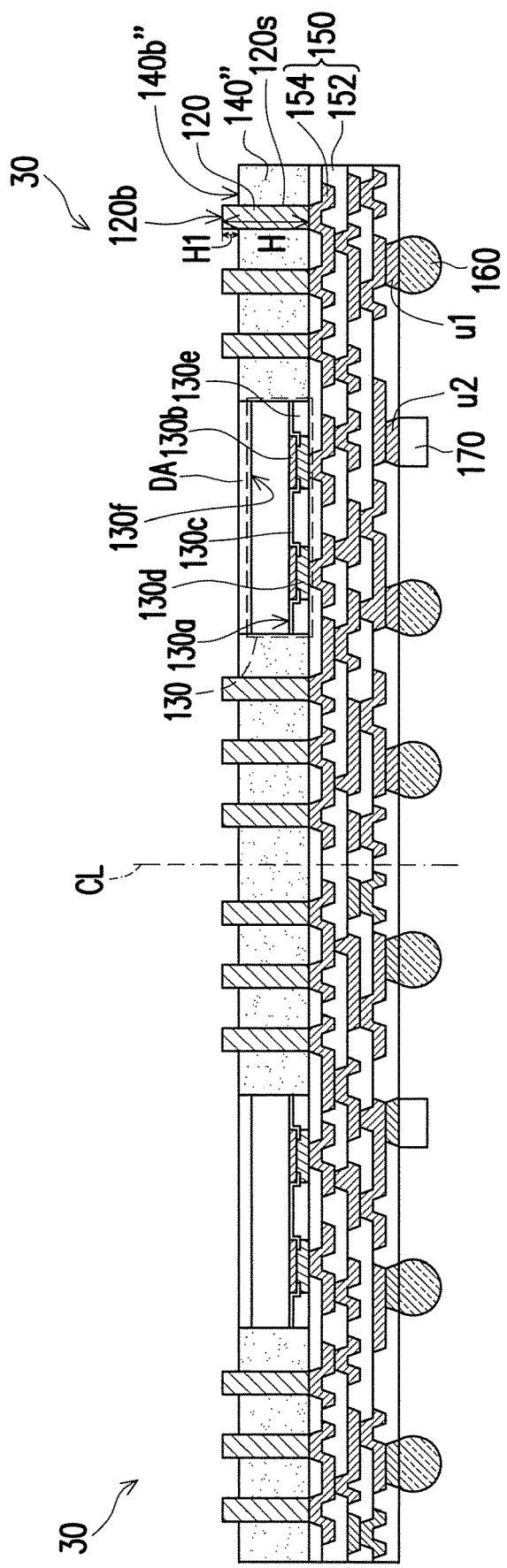
FIG. 4A to FIG. 4E are schematic cross sectional views of various stages in a manufacturing method of a package structure according to some exemplary embodiments of the disclosure.

Referring in FIG. 4A, in some embodiments, the first package 10 depicted in FIG. 1G is flipped (e.g. turned upside down), and the planarized insulating encapsulation 140' is etched to expose portions of the TIVs 120 so as to form a first package 30. In some embodiments, the planarized insulating encapsulation 140' is etched by a patterning process to form a patterned insulating encapsulation 140" partially exposing the TIVs 120. In certain embodiments, the patterning process is a plasma etching process, however the disclosure is not limited thereto. In certain embodiments, the portions of the TIVs 120 exposed by the patterned insulating encapsulation 140" are protruded out of a bottom surface 140b" of the patterned insulating encapsulation 140" with a height H1, where the height H1 is also referred as a height of the portions of the TIVs 120 exposed by the patterned insulating encapsulation 140" and protruded out of a bottom surface 140b" of the patterned insulating encapsulation 140". In some embodiments, a ratio of the height H1 to a total height H of the TIVs 120 is in a range of about 0.06 to about 0.3, approximately. In other words, the bottom surfaces 120b and parts of the sidewalls 120s of the TIVs 120 are exposed by the patterned insulating encapsulation 140", where the height H1 measured from the bottom surface 140b" of the patterned insulating encapsulation 140" to the bottom surfaces 120b of the TIVs 120 along a direction perpendicular to the bottom surface 140b" of the patterned insulating encapsulation 140" is ranging from about 10 um to about 50 um (see FIG. 4A).

Figure 4B:
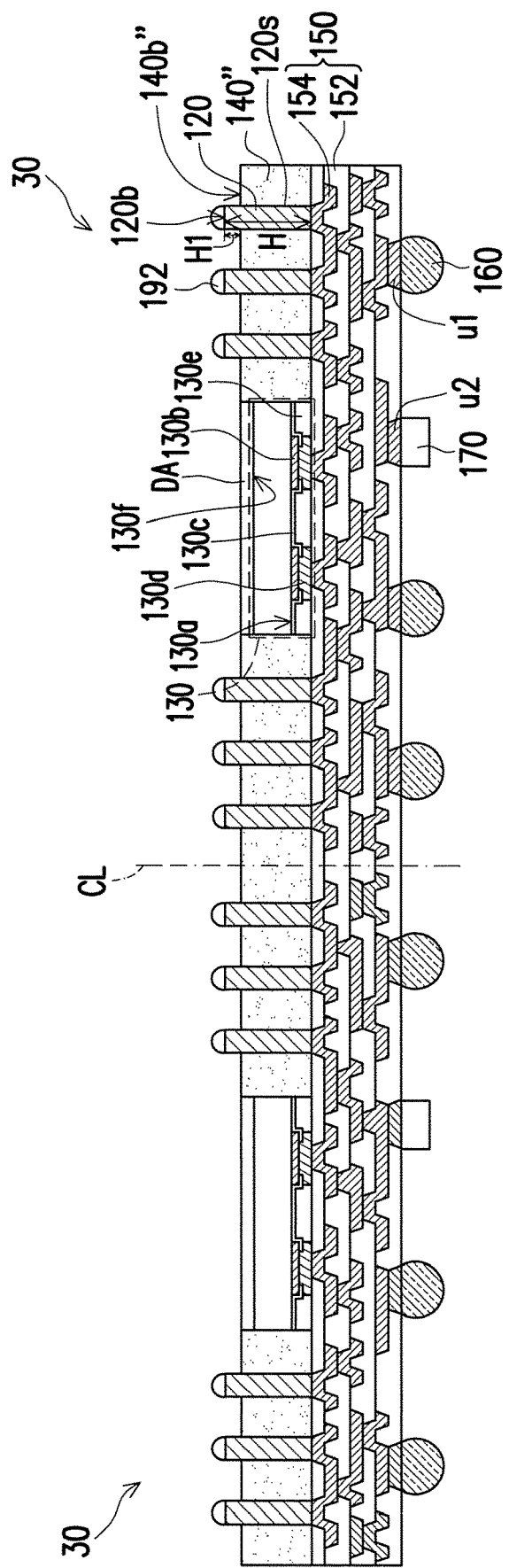

Referring to FIG. 4B, in some embodiments, pre-solders 192 are formed on the bottom surfaces 120b of the TIVs 120. In some embodiments, the pre-solders 192 are pre-solder pastes, for example. In an alternative embodiment, the pre-solders 192 may be pre-solder blocks. In some embodiments, the material of the pre-solders 192 may include a lead-free solder material (such as Sn—Ag base or Sn—Ag—Cu base materials) with or without additional impurity (such as Ni, Bi, Sb, Au, or the like.). The disclosure is not limited thereto.

Figure 4C:
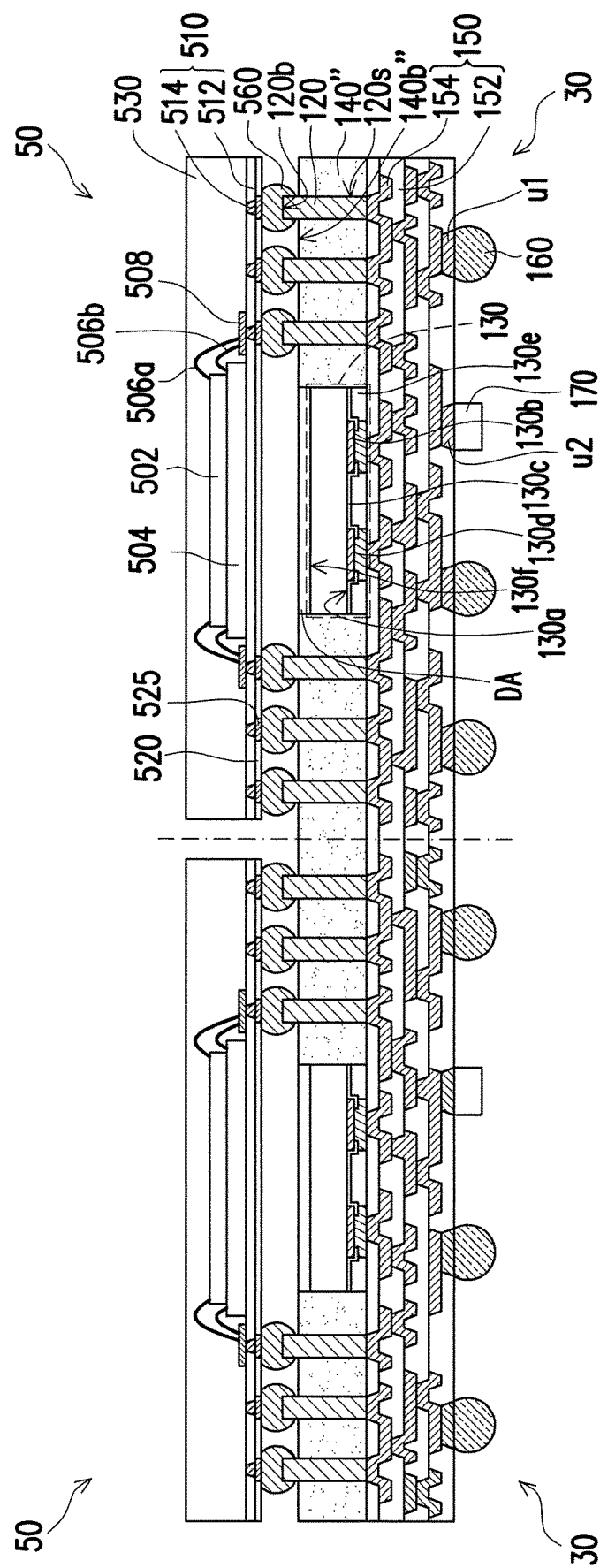

Referring to FIG. 4C, in some embodiments, the second package 50 depicted in FIG. 1I is provided and mounted onto the first package 30 depicted in FIG. 4A by connecting the solder elements 194 and the pre-solders 192 so as to respectively form solder joints 560 on the TIVs 120. In some embodiments, the solder joints 560 are located between the first package 30 and the second package 50. In certain embodiments, the first package 30 and the second package 50 are electrically connected through the solder joints 560 and the TIVs 120. In some embodiments, a reflow processing is preformed to physically connect the solder elements 194 and the pre-solders 192 so as to form the solder joints 560, where the bottom surfaces 120b of the TIVs 120 and a portion of the sidewalls 120s thereof, which are exposed by and protruded out of the bottom surface 140b" of the patterned insulating encapsulation 140", are covered by the solder joints 560.

Figure 4D:
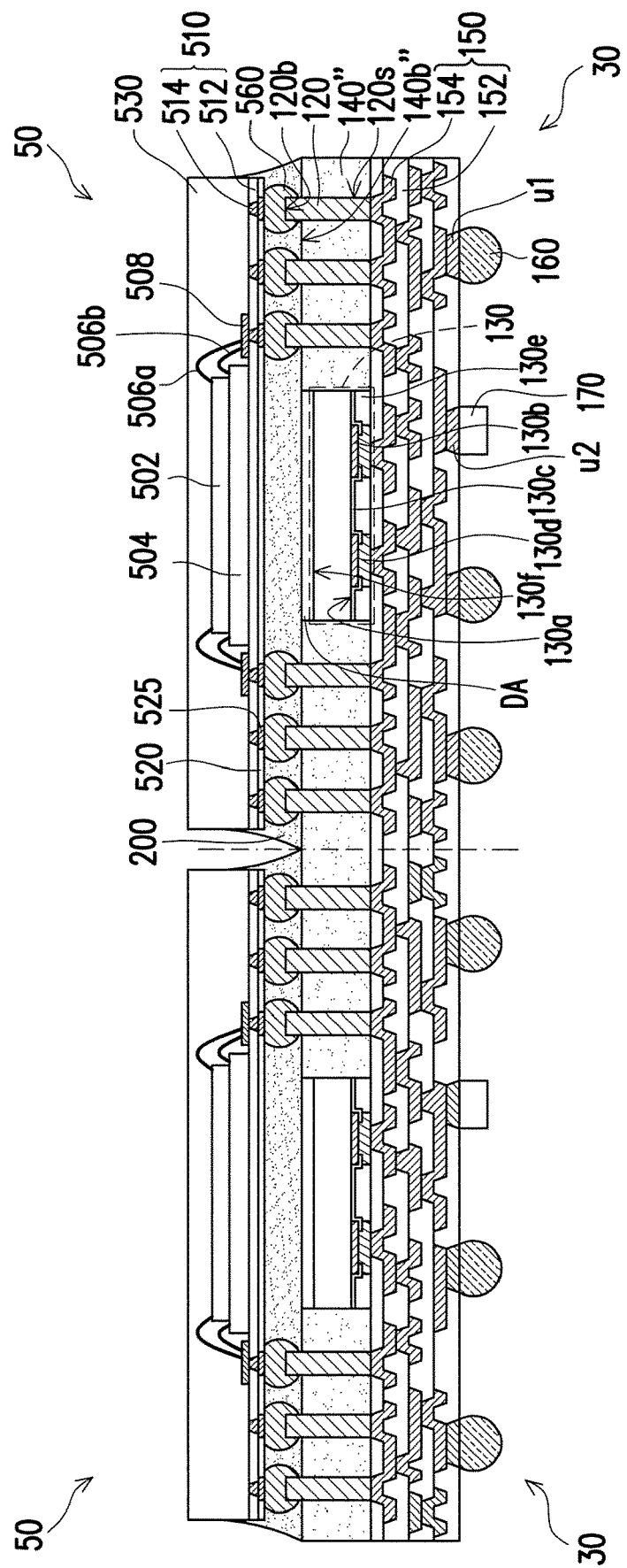

Referring to FIG. 4D, in some embodiments, the underfill material 200 is filled between the second package 50 and the first package 30. In certain embodiments, the underfill material 200 at least fills the gaps between the solder mask layer 520 of the second package 50, the solder joints 560, the TIVs 120 and the patterned insulating encapsulation 140" of the first package 30. In some embodiments, the underfill material 200 covers and is in contact with the solder mask layer 520 of the second package 50, the solder joints 560, the TIVs 120 and the patterned insulating encapsulation 140" of the first package 30. In one embodiment, the underfill material 200 may be formed by underfill dispensing or any other suitable method. In some embodiments, a material of the underfill material and the patterned insulating encapsulation 140" (or saying the insulating encapsulation 140) may be the same or different, the disclosure is not limited thereto.

Figure 4E:
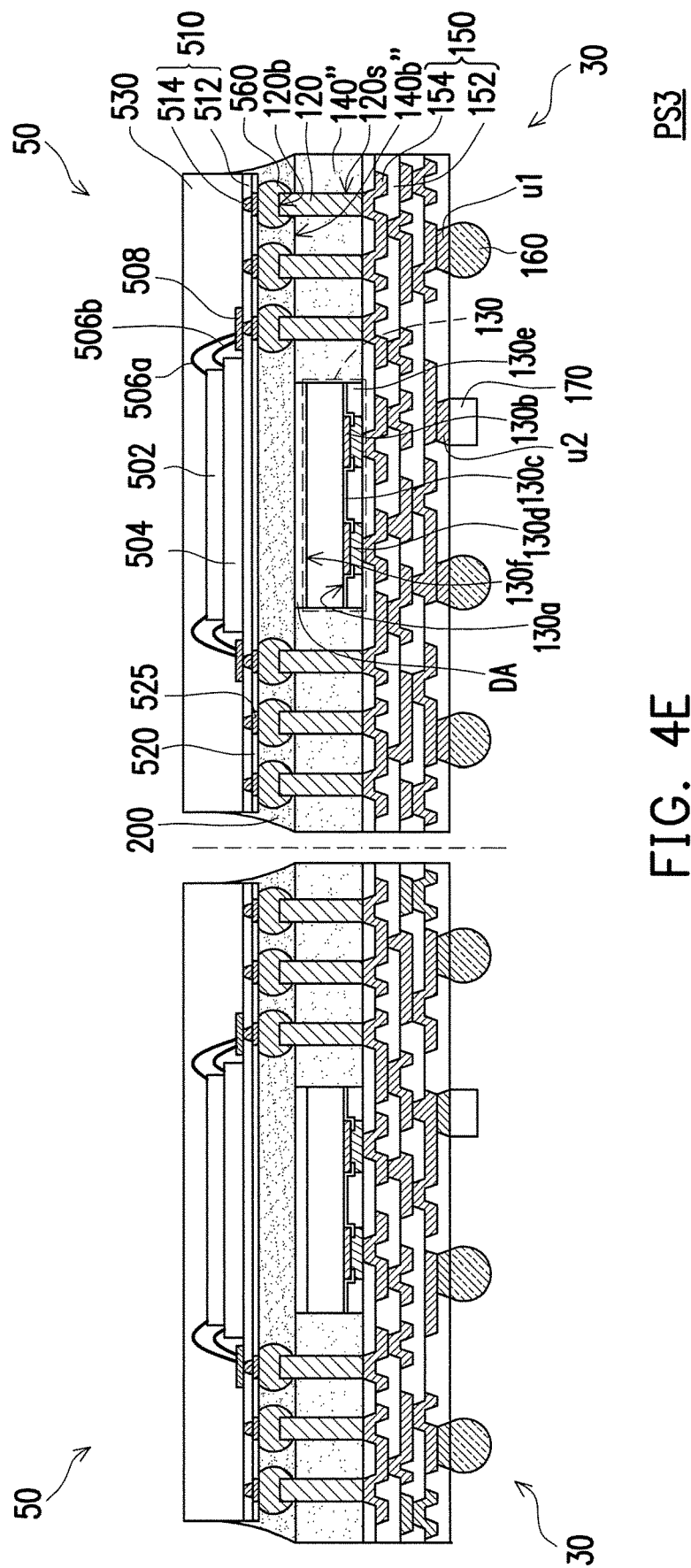

Referring to FIG. 4E, in some embodiments, a singulation (dicing) process is performed to cut though at least the underfill material 200, the first redistribution layer 150 and the patterned insulating encapsulation 140" along the cutting line CL (the dotted line) so as to form individual and separate PoP structures PS3. In one embodiment, the singulation (dicing) process is a wafer dicing process including mechanical sawing or laser cutting. Up to here, the manufacture of the PoP structure PS3 is completed.

Figure 5A:
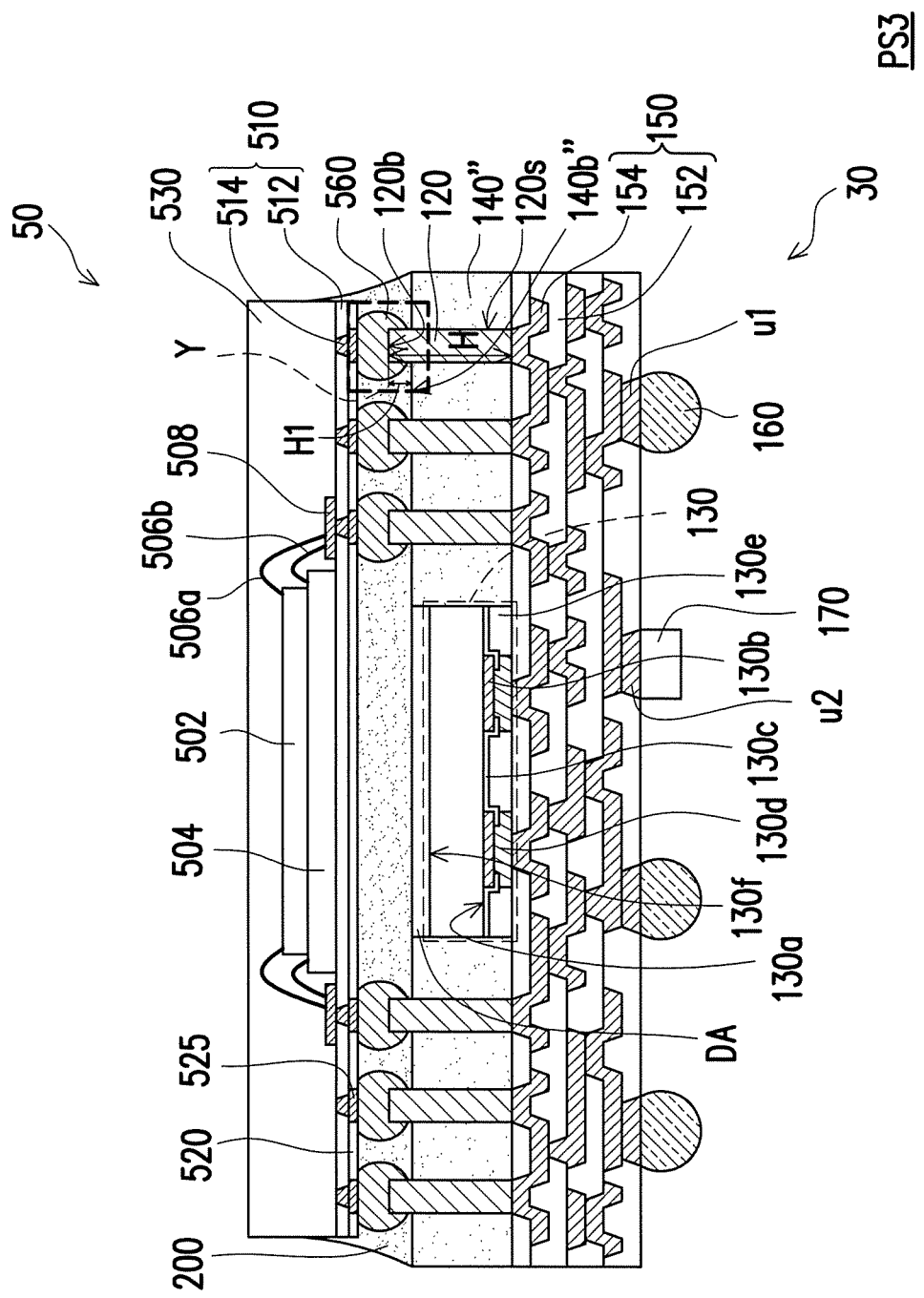
FIG. 5A is a schematic cross sectional view of a package structure according to some exemplary embodiments of the disclosure.
Figure 5C:
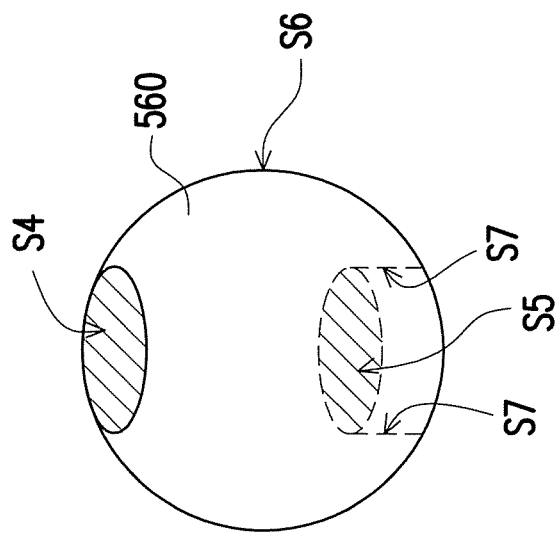
FIG. 5C is a schematic three-dimensional cutaway diagram illustrating a solder joint depicted in FIG. 5A.
Figure 5B:
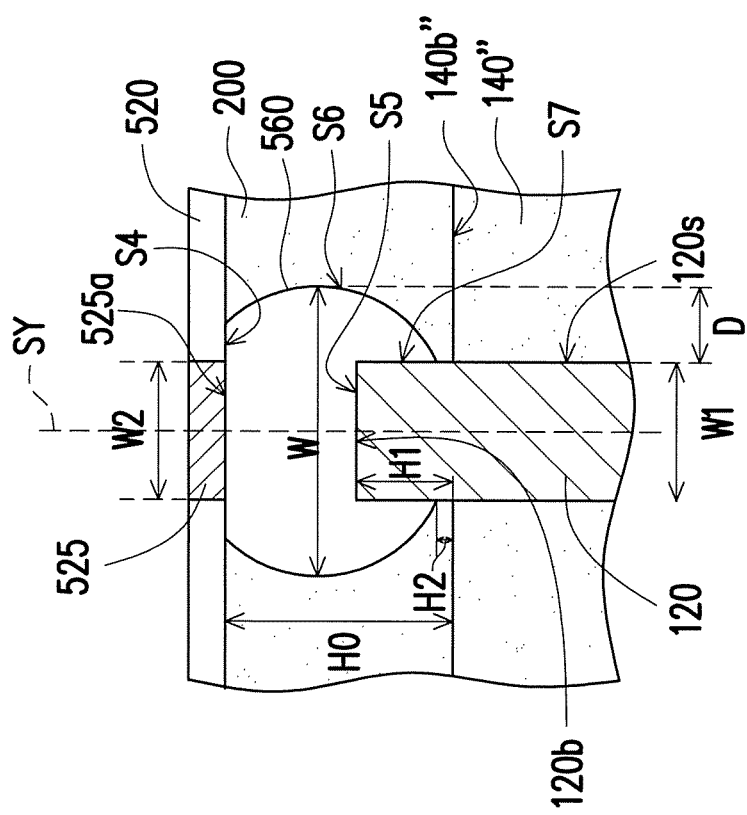
FIG. 5B is an enlarged, schematic cross-sectional view of the package structure depicted in FIG. 5A.

FIG. 5A is a schematic cross sectional view of a package structure according to some exemplary embodiments of the disclosure. FIG. 5B is an enlarged, schematic cross-sectional view of the package structure depicted in FIG. 5A, where FIG. 5B shows an enlarged region indicated with a dotted box Y depicted in FIG. 5A. FIG. 5C is a schematic three-dimensional cutaway diagram illustrating a solder joint depicted in FIG. 5A. The PoP structure PS3 of FIG. 5A may be fabricated following the previously described manufacturing process as described in FIG. 1A to FIG. 1G and FIG. 4A to FIG. 4E. In some embodiments, the PoP structure PS3 includes the first package 30, the second package 50, the solder joints 560 electrically connecting and located between the first package 30 and the second package 50, and the underfill material 200 located between the first package 30 and the second package 50 and encapsulating the solder joints 560.

Referring to FIG. 5A, the first package 30 includes the TIVs 120, the semiconductor die 130, the patterned insulating encapsulation 140", the first redistribution layer 150, the conductive elements 160, the semiconductor element 170, and the connecting pads u1, u2. In some embodiments, the semiconductor die 130 and a portion of each of the TIVs 120 are encapsulated in the patterned insulating encapsulation 140". In other words, the portions of the TIVs 120 are exposed by the patterned insulating encapsulation 140" and protruded out of the bottom surface 140b" of the patterned insulating encapsulation 140" with a height H1. In some embodiments, a ratio of the height H1 of the portions of the TIVs 120 exposed by the patterned insulating encapsulation 140" and protruded out of the bottom surface 140b" of the patterned insulating encapsulation 140" to the total height H of the TIVs 120 is in a range of about 0.06 to about 0.3. In some embodiments, along the direction perpendicular to the bottom surface 140b" of the patterned insulating encapsulation 140", the height H1 measured from the bottom surface 140b" of the patterned insulating encapsulation 140" to the bottom surfaces 120b of the TIVs 120 is ranging from 10 um to 50 um, approximately.

In some embodiments, the first redistribution layer 150 is located on the patterned insulating encapsulation 140" and is electrically connected to the TIVs 120 and the conductive pillars 130d of the semiconductor die 130. In some embodiments, the conductive elements 160 and the semiconductor element 170 are electrically connected to the first redistribution layer 150 through the connecting pads u1 located between the first redistribution layer 150 and the conductive elements 160 and the connecting pad u2 located between the first redistribution layer 150 and the semiconductor element 170, respectively. In some embodiments, the first redistribution layer 150 is located between the connecting pads u1 and the patterned insulating encapsulation 140" and the connecting pad u2 and the patterned insulating encapsulation 140".

Continued on FIG. 5A, the second package 50 includes the semiconductor die 502, the semiconductor die 504, the wirings 506a, 506b, the contact pads 508, the second redistribution layer 510, the solder mask layer 520, the conductive pads 525, and the insulating encapsulation 530. In some embodiments, the semiconductor die 502 and the semiconductor die 504 are stacked and are respectively connected to the contact pads 508 through the wirings 506a and 506b. In some embodiments, the semiconductor die 502 and the semiconductor die 504, the wirings 506a, 506b, and the contact pads 508 are encapsulated in the insulating encapsulation 530. In some embodiments, the second redistribution layer 510 is located on the insulating encapsulation 530 and is physically connected to the contact pads 508. In some embodiments, the solder mask layer 520 and the conductive pads 525 are located on the second redistribution layer 510, where the second redistribution layer 510 is located between the solder mask layer 520 and the insulating encapsulation 530 and between the conductive pads 525 and the insulating encapsulation 530. In some embodiments, the conductive pads 525 are electrically connected to at least one of the semiconductor die 502 and the semiconductor die 504 through the second redistribution layer 510, the contact pads 508, and the corresponding one of the wirings 506a, 506b.

In some embodiments, the solder joints 560 are located between the first package 30 and the second package 50, where the first package 30 and the second package 50 are electrically connected through the solder joints 560. In some embodiments, as shown in FIG. 5A, the solder joints 560 physically contacts the TIVs 120, the patterned insulating encapsulation 140", the conductive pads 525, and the solder mask layer 520.

Referring to FIG. 5B to FIG. 5C, certain structural features including the solder mask layer 520 and the conductive pad 525 of the second package 50, the TIV 120 and the patterned insulating encapsulation 140" of the first package 30, the solder joint 560 and the underfill material 200 located therebetween are stressed for illustration purposes, and only one TIV 120, only one conductive pad 525 and one solder joint 560 are shown in FIG. 5B for easy illustration. In some embodiments, the solder joint 560 is located between the conductive pad 525 and the TIV 120 for electrical connection of two packages (e.g., the first package 30 and the second package 50). In some embodiments, the solder joint 560 is further located between the solder mask layer 520 and the patterned insulating encapsulation 140".

In some embodiments, as shown in FIGS. 5B and 5C, the solder joint 560 has a first contact surface S4, a second contact surface S5 opposite to the first contact surface S4, a side surface S6 connecting the first contact surface S4, and an inner surface S7 connected to the side surface S6 and the second contact surface S5. In some embodiments, the first contact surface S4 of the solder joint 560 is in contact with a top surface 525a of the conductive pad 525, the second contact surface S5 of the solder joint 560 is in contact with the bottom surface 120b of the TIV 120, and the inner surface S7 is in contact with the portion of the sidewall 120s of the TIV 120 protruding out of the bottom surface 140b" of the patterned insulating encapsulation 140". In some embodiments, the side surface S6 of the solder joint 560 is covered by and in physical contact with the underfill material 200. In some embodiments, the first contact surface S4 and the second contact surface S5 are planes. In certain embodiments, as shown in FIG. 5C, the solder joint 560 is a round ball with two truncated ends, where an area of the first contact surface S4 is substantially equal to an area of the second contact surface S5, for example.

In some embodiments, as shown in FIG. 5B, along a horizontal direction that is substantially parallel to the bottom surface 140b" of the patterned insulating encapsulation 140", a maximum size W of the solder joint 560 is greater than a maximum size W1 of the TIV 120 and is greater than a maximum size W2 of the conductive pad 525, and the maximum size W2 of the conductive pad 525 is substantially equal to the maximum size W1 of the TIV 120. In some embodiments, a ratio of the maximum size W of the solder joints 560 to the maximum size W1 of the TIVs 120 is greater than or substantially equal to 1.1 and less than or substantially equal to 1.6. In some embodiments, a ratio of the maximum size W of the solder joints 560 to the maximum size W2 of the conductive pads 525 is greater than or substantially equal to 1.1 and less than or substantially equal to 1.6. In some embodiments, as shown in FIG. 5B, along a direction perpendicular to the central line SY of the solder joint 560, a maximum distance D between the sidewall 120s of the TIV 120 and the side surface S6 of the solder joint 560 is in a range of about 50 µm to about 100 µm, approximately.

In certain embodiments, in a vertical cross-section of the solder joint 560, the side surface S6 of the solder joint 560 is a curved surface (e.g. a convex curved surface) relative to a central line SY of the solder joint 560, where the vertical cross-section of the solder joint 560 is taken along a vertical plane perpendicular to the bottom surface 140b" of the patterned insulating encapsulation 140", and the vertical plane perpendicular to the bottom surface 140b" of the patterned insulating encapsulation 140" simultaneously passes through the TIVs 120, the patterned insulating encapsulation 140", solder mask layer 520, the conductive pads 525, the solder joint 560, and the underfill material 200. In some embodiments, along the vertical plane perpendicular to the bottom surface 140b" of the patterned insulating encapsulation 140", a ratio of the cross-sectional area of the solder joints 560 to the cross-sectional area of the TIVs 120 is greater than or substantially equal to 1 and less than or substantially equal to 1.5. In some embodiments, a ratio of the cross-sectional area of the solder joints 560 to the cross-sectional area of the conductive pads 525 is greater than or substantially equal to 1 and less than or substantially equal to 1.5.

In other words, along the direction of the central line SY (from the bottom surface 140b" of the patterned insulating encapsulation 140" to the top surface 525a of the conductive pad 525, or vice versa), a lateral distance between the side surface S6 of the solder joint 560 and the central line SY is increased and then decreased, where the lateral distance is a distance taken along a direction perpendicular to the central line SY. As shown in FIG. 5B, an interface of the vertical cross-section of the solder joint 560 and the underfill material 200 is a non-planar surface (e.g., a curved surface) and an interface of the vertical cross-section of the TIV 120 and the patterned insulating encapsulation 140" is a planar surface (e.g., a flat surface), such that the interface between the solder joint 560 and the underfill material 200 in the vertical cross-section and the interface between the TIV 120 and the patterned insulating encapsulation 140" in the vertical cross-section are not aligned as straight lines. Due to the misalignment of the interfaces, a delamination at the interface of the TIV 120 and the patterned insulating encapsulation 140" caused by a stress coming from the interface of the side surface S6 of the solder joint 560 and the underfill material 200 can be suppressed, thereby achieving a better electrical performance. Accordingly, with such configuration, in certain embodiments, the process step illustrated in FIG. 4B may be optionally omitted.

In some embodiments, the exposed portion of the TIV 120 exposed by and protruded out of the bottom surface 140b" of the patterned insulating encapsulation 140" and covered by the underfill material 200 (e.g. a portion of the exposed portion of the TIV 120 protruded from the patterned insulating encapsulation 140" without being in contact with the solder joint 560) has a height of H2. In some embodiments, a ratio of the height H1 of the exposed portion of the TIV 120 exposed by and protruded from the patterned insulating encapsulation 140" and covered by the solder joint 560 to the height H2 of the exposed portion of the TIV 120 exposed by and protruded from the patterned insulating encapsulation 140" and covered by the underfill material 200 is in a range of about 1 to about 5, approximately. In some embodiments, a ratio of a height H0 of the underfill material 200 to the height H2 of the exposed portion of the TIV 120 exposed by and protruded from the patterned insulating encapsulation 140" and covered by the underfill material 200 is in a range of about 5 to about 10, approximately. As shown in FIG. 5B, an interface of the TIV 120 and the underfill material 200 is located between the interface of the solder joint 560 and the underfill material 200 and the interface of the TIV 120 and the patterned insulating encapsulation 140" along a stacking direction of the solder mask layer 520, the underfill material 200, and the patterned insulating encapsulation 140". Due to the presence of the interface of the TIV 120 and the underfill material 200, a delamination at the interface of the TIV 120 and the patterned insulating encapsulation 140" caused by a stress coming from the interface of the side surface S6 of the solder joint 560 and the underfill material 200 can be further suppressed.

Figure 6A:
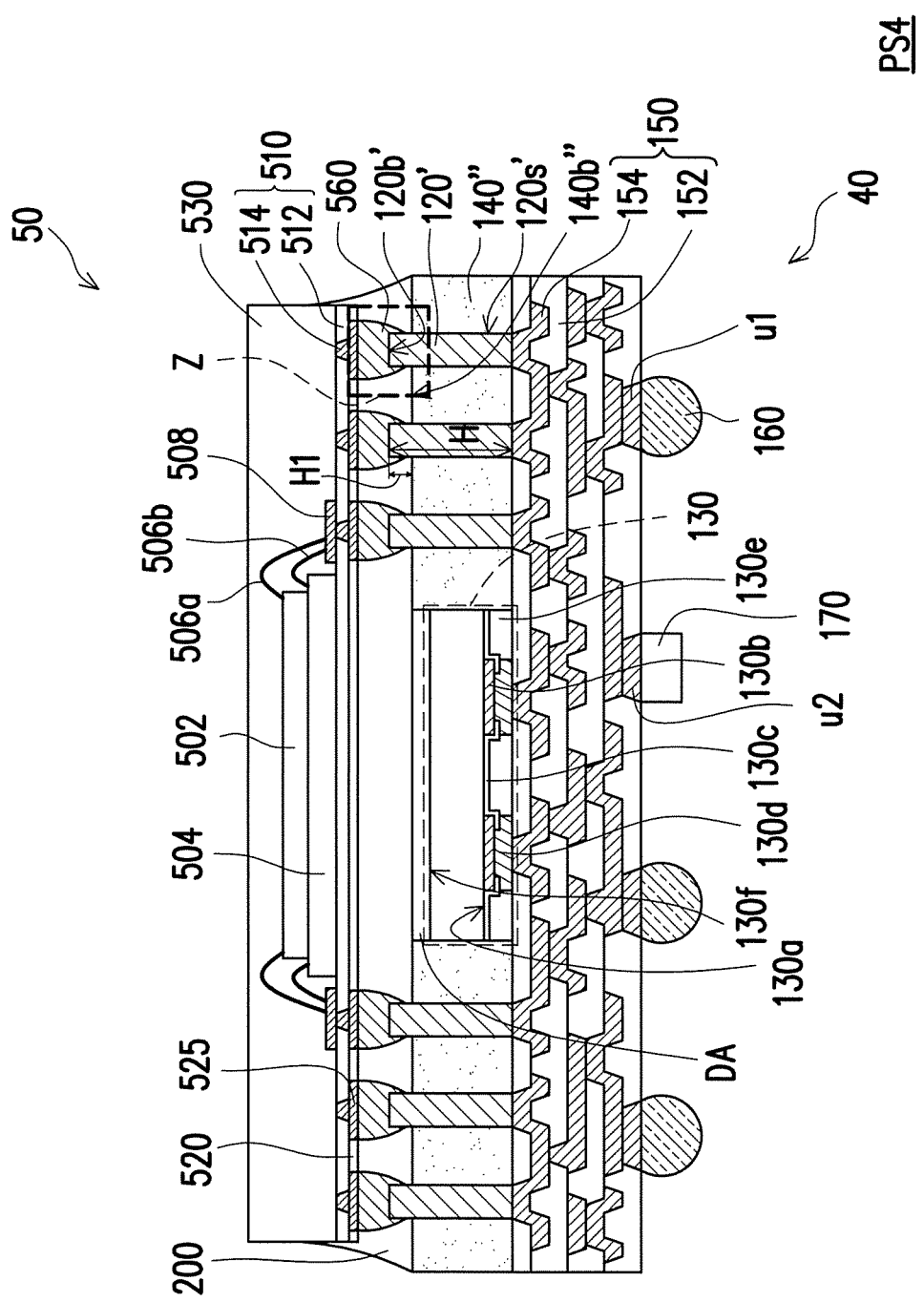
FIG. 6A is a schematic cross sectional view of a package structure according to some exemplary embodiments of the disclosure.
Figure 6C:
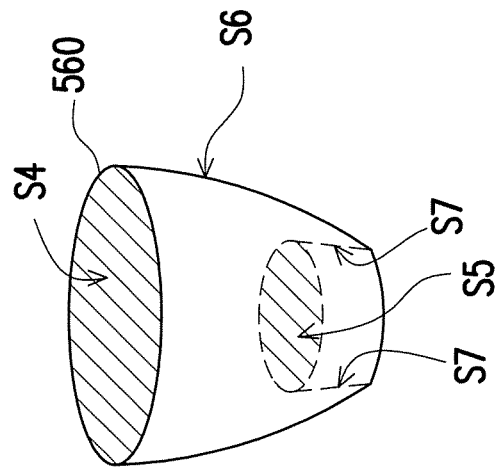
FIG. 6C is a schematic three-dimensional cutaway diagram illustrating a solder joint depicted in FIG. 6A.
Figure 6B:
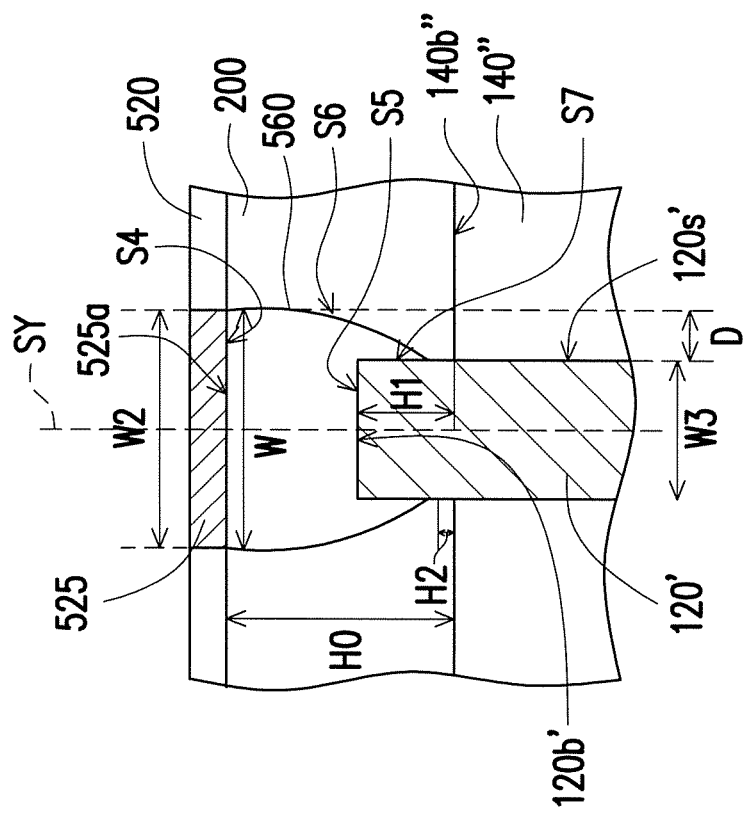
FIG. 6B is an enlarged, schematic cross-sectional view of the package structure depicted in FIG. 6A.

FIG. 6A is a schematic cross sectional view of a package structure according to some exemplary embodiments of the disclosure. FIG. 6B is an enlarged, schematic cross-sectional view of the package structure depicted in FIG. 6A, where FIG. 6B shows an enlarged region indicated with a dotted box Z depicted in FIG. 6A. FIG. 6C is a schematic three-dimensional cutaway diagram illustrating a solder joint depicted in FIG. 6A.

The PoP structure PS4 of FIG. 6A may be fabricated following the previously described manufacturing process as described in FIG. 1A to FIG. 1G and FIG. 4A to FIG. 4E. The PoP structure PS3 depicted in FIG. 5A and the PoP structure PS4 depicted in FIG. 6A are similar, and thus the elements depicted in FIG. 6A that are similar to or substantially the same as the elements described above in FIG. 5A will use the same reference numbers, and certain details or descriptions of the same elements will not be repeated herein, for simplicity. Similarly, the elements depicted in FIG. 6B and FIG. 6C similar to or substantially the same as the elements described above in FIGS. 5B and 5C will use the same reference numbers, and certain details or descriptions of the same elements will not be repeated herein.

In some embodiments, the PoP structure PS4 includes the first package 40, the second package 50, the solder joints 560 electrically connecting and located between the first package 40 and the second package 50, and the underfill material 200 located between the first package 40 and the second package 50 and encapsulating the solder joints 560. Referring to FIG. 5A and FIG. 6A together, the PoP structure PS4 depicted in FIG. 6A has substituted the first package 30 with a first package 40, where the difference is that, in the first package 40 depicted in FIG. 6A, the TIVs 120' have a maximum size W3 less than the maximum size W1 along the horizontal direction substantially parallel to the bottom surface 140b" of the patterned insulating encapsulation 140". In other words, the TIVs 120' depicted in the FIG. 6A and FIG. 6B are considered as thin through insulator vias as comparing with the TIVs 120 depicted in the FIG. 5A and FIG. 5B. With such configuration, in certain embodiments, the process step illustrated in FIG. 4B may be optionally omitted.

In certain embodiments, as shown in FIG. 6B, along the horizontal direction substantially parallel to the bottom surface 140b" of the patterned insulating encapsulation 140", the maximum size W of the solder joint 560 is greater than the maximum size W3 of the TIV 120' and is greater than the maximum size W2 of the conductive pad 525, and the maximum size W2 of the conductive pad 525 is greater than the maximum size W3 of the TIV 120'. In some embodiments, a ratio of the maximum size W of the solder joints 560 to the maximum size W3 of the TIVs 120' is greater than or substantially equal to 1.1 and less than or substantially equal to 2. In some embodiments, a ratio of the maximum size W of the solder joints 560 to the maximum size W2 of the conductive pads 525 is greater than or substantially equal to 1.1 and less than or substantially equal to 1.6. In some embodiments, a ratio of the maximum size W3 of the TIVs 120' to the maximum size W2 of the conductive pads 525 is greater than or substantially equal to 0.5 and less than 1. In some embodiments, along the horizontal direction, a ratio of the cross-sectional area of the solder joints 550 to the cross-sectional area of the TIVs 120' is greater than or substantially equal to 1 and less than or substantially equal to 1.5. In some embodiments, a ratio of the cross-sectional area of the solder joints 550 to the cross-sectional area of the conductive pads 525 is greater than or substantially equal to 1 and less than or substantially equal to 1.5.

In some embodiments, as shown in FIGS. 6B and 6C, the solder joint 560 has a first contact surface S4, a second contact surface S5 opposite to the first contact surface S4, a side surface S6 connecting the first contact surface S4, and an inner surface S7 connected to the side surface S6 and the second contact surface S5. In some embodiments, the first contact surface S4 of the solder joint 560 is in contact with a top surface 525a of the conductive pad 525, the second contact surface S5 of the solder joint 560 is in contact with the bottom surface 120b' of the TIV 120', and the inner surface S7 is in contact with the portion of the sidewall 120s' of the TIV 120' protruded out of the bottom surface 140b'' of the patterned insulating encapsulation 140''. In some embodiments, as shown in FIG. 6B, along the direction perpendicular to the central line SY of the solder joint 560, a maximum distance D between the sidewall 120s' of the TIV 120' and the side surface S6 of the solder joint 560 is in a range of about 50 µm to about 100 µm, approximately. In some embodiments, as shown in FIG. 6C, the solder joint 560 is a round ball with two truncated-ends, where an area of the first contact surface S4 is greater than an area of the second contact surface S5.

Referring to FIG. 6B, in some embodiments, along the direction of the central line SY from the bottom surface 120b' of the TIV 120' to the top surface 525a of the conductive pad 525, the lateral distance between the side surface S6 of the solder joint 560 and the central line SY is increased. That is, the interface of the vertical cross-section of the solder joint 560 and the underfill material 200 is a non-planar surface (e.g. a curved surface) and the interface of the vertical cross-section of the TIV 120' and the patterned insulating encapsulation 140'' is a planar surface (e.g., a flat surface), such that the interface between the solder joint 560 and the underfill material 200 in the vertical cross-section and the interface between the TIV 120' and the patterned insulating encapsulation 140'' in the vertical cross-section are not aligned as straight lines. Due to the misalignment of the interfaces, a delamination at the interface of the TIV 120' and the patterned insulating encapsulation 140'' caused by a stress coming from the interface of the side surface S6 of the solder joint 560 and the underfill material 200 can be suppressed, thereby achieving a better electrical performance.

In some embodiments, the exposed portion of the TIV 120' exposed by and protruded out of the bottom surface 140b'' of the patterned insulating encapsulation 140'' and covered by the underfill material 200 (e.g. a portion of the exposed portion of the TIV 120 protruded from the patterned insulating encapsulation 140'' without being in contact with the solder joint 560) has a height of H2. In some embodiments, a ratio of the height H1 of the exposed portion of the TIV 120' exposed by and protruded from the patterned insulating encapsulation 140'' and covered by the solder joint 560 to the height H2 of the exposed portion of the TIV 120' exposed by and protruded from the patterned insulating encapsulation 140'' and covered by the underfill material 200 is in a range of about 1 to about 5, approximately. In some embodiments, a ratio of the height H0 of the underfill material 200 to the height H2 of the exposed portion of the TIV 120' exposed by and protruded from the patterned insulating encapsulation 140'' and covered by the underfill material 200 is in a range of about 5 to about 10, approximately. As shown in FIG. 6B, an interface of the TIV 120' and the underfill material 200 is located between the interface of the solder joint 560 and the underfill material 200 and the interface of the TIV 120' and the patterned insulating encapsulation 140'' along a stacking direction of the solder mask layer 520, the underfill material 200, and the patterned insulating encapsulation 140''. Due to the presence of the interface of the TIV 120' and the underfill material 200, a delamination at the interface of the TIV 120' and the patterned insulating encapsulation 140'' caused by a stress coming from the interface of the side surface S6 of the solder joint 560 and the underfill material 200 can be further suppressed.

According to some embodiments, a package structure includes a first package, a second package, and solder joints. The first package includes at least one first semiconductor die encapsulated in an insulating encapsulation and through insulator vias electrically connected to the at least one first semiconductor die, wherein the through insulator vias are encapsulated in the insulating encapsulation. The second package is located on the first package and includes at least one second semiconductor die and conductive pads electrically connected to the at least one second semiconductor die. The solder joints are located between the first package and the second package, wherein the first package and the second package are electrically connected through the solder joints. A maximum size of the solder joints is greater than a maximum size of the through insulator vias measuring along a horizontal direction, and is greater than or substantially equal to a maximum size of the conductive pads measuring along the horizontal direction.

According to some embodiments, a package structure includes a first package, a second package, and solder joints. The first package includes at least one first semiconductor die encapsulated in an insulating encapsulation and through insulator vias electrically connected to the at least one first semiconductor die. Each of the through insulator vias is partially covered by the insulating encapsulation with a portion exposed and protruded out of the insulating encapsulation with a distance. The second package is located on the first package and includes at least one second semiconductor die and conductive pads electrically connected to the at least one second semiconductor die. The solder joints are located between the first package and the second package, wherein the first package and the second package are electrically connected through the solder joints. A cross-sectional area of the solder joints is greater than a cross-sectional area of the through insulator vias measuring along a horizontal direction, and is greater than or substantially equal to a cross-sectional area of the conductive pads measuring along the horizontal direction.

According to some embodiments, a manufacturing method of a package structure includes the following steps: providing a first package having through insulator vias encapsulated in an insulating encapsulation; etching the insulating encapsulation to expose portions of the through insulator vias from the insulating encapsulation; providing a second package having conductive pads; forming solder elements on the conductive pads, respectively; forming pre-solders on the exposed portions of the through insulator vias; and connecting the solder elements and the pre-solders and forming solder joints between the first package and the second package, wherein the first package and the second package are electrically connected to each other through the solder joints.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a first package, comprising:
      at least one first semiconductor die, encapsulated in an insulating encapsulation; and
      through insulator vias, electrically connected to the at least one first semiconductor die, wherein the through insulator vias are encapsulated in the insulating encapsulation;
   a second package, located on the first package, comprising:
      at least one second semiconductor die; and
      conductive pads, electrically connected to the at least one second semiconductor die; and
   solder joints, located between the first package and the second package, wherein the first package and the second package are electrically connected through the solder joints;
   an underfill, located between the first package and the second package, wherein the solder joints are encapsulated in the underfill, and a sidewall of the second package is covered by the underfill, and
   wherein a maximum size of the solder joints is greater than a maximum size of the through insulator vias measuring along a horizontal direction, and is greater than or substantially equal to a maximum size of the conductive pads measuring along the horizontal direction,
   wherein a maximum size of a surface of one of the solder joints physically contacting a surface of a respective one of the conductive pads is greater than a maximum size of the surface of the respective one of the conductive pads.

2. The package structure of claim 1, wherein a ratio of the maximum size of the solder joints to the maximum size of the through insulator vias is greater than or substantially equal to 1.1 and less than or substantially equal to 2.

3. The package structure of claim 1, wherein a ratio of the maximum size of the solder joints to the maximum size of the conductive pads is greater than or substantially equal to 1.1 and less than or substantially equal to 1.6.

4. The package structure of claim 1, wherein the maximum size of the conductive pads is substantially equal to the maximum size of the through insulator vias.

5. The package structure of claim 4, wherein each of the solder joints has a first contact surface, a second contact surface opposite to the first contact surface and a side surface connecting the first and second contact surfaces, wherein the first contact surface of the solder joint is connected to one of the conductive pads and the second contact surface of the solder joint is connected to one of the through insulator vias, and an area of the first contact surface is substantially equal to an area of the second contact surface.

6. The package structure of claim 4, wherein each of the solder joints has a first contact surface, a second contact surface opposite to the first contact surface and a side surface connecting the first and second contact surfaces, wherein the first contact surface of the solder joint is connected to one of the conductive pads and the second contact surface of the solder joint is connected to one of the through insulator vias, and an area of the first contact surface is greater than an area of the second contact surface.

7. The package structure of claim 1, wherein an interface of a vertical cross-section of the solder joints and the underfill is a curved surface.

8. The package structure of claim 7, wherein a portion of each of the through insulator vias are free of the insulating encapsulation and wrapped by the underfill.

9. The package structure of claim 8, wherein an interface of a vertical cross-section of the portion of each of the through insulator vias being free of the insulating encapsulation and wrapped by the underfill is a planar surface.

10. A package structure, comprising:
    a first package, comprising:
       at least one first semiconductor die, encapsulated in an insulating encapsulation; and
       through insulator vias, electrically connected to the at least one first semiconductor die, wherein each of the through insulator vias is partially covered by the insulating encapsulation with a portion exposed and protruded out of the insulating encapsulation with a distance;
    a second package, located on the first package, comprising:
       at least one second semiconductor die; and
       conductive pads, electrically connected to the at least one second semiconductor die;
    solder joints, located between the first package and the second package, wherein the first package and the second package are electrically connected through the solder joints;
    an underfill, located between the first package and the second package, wherein sidewalls of the solder joints and a sidewall of the portion of each of the through insulator vias exposed by and protruded out of the insulating encapsulation are directly covered by the underfill, and a sidewall of the second package is covered by the underfill, and
    wherein a cross-sectional area of the solder joints is greater than a cross-sectional area of the through insulator vias measuring along a horizontal direction, and is greater than or substantially equal to a cross-sectional area of the conductive pads measuring along the horizontal direction,
    wherein a maximum size of a surface of one of the solder joints physically contacting a surface of a respective one of the conductive pads is greater than a maximum size of the surface of the respective one of the conductive pads.

11. The package structure of claim 10, wherein a ratio of the cross-sectional area of the solder joints to the cross-sectional area of the through insulator vias is greater than or substantially equal to 1 and less than or substantially equal to 1.5.

12. The package structure of claim 10, wherein a ratio of the cross-sectional area of the solder joints to the cross-sectional area of the conductive pads is greater than or substantially equal to 1 and less than or substantially equal to 1.5.

13. The package structure of claim 10, wherein the cross-sectional area of the conductive pads is substantially equal to the cross-sectional area of the through insulator vias.

14. The package structure of claim 13, wherein each of the solder joints has a first contact surface, a second contact surface opposite to the first contact surface and a side surface connecting the first and second contact surfaces, wherein the first contact surface of the solder joint is connected to one of the conductive pads and the second contact surface of the solder joint is connected to one of the through insulator vias, and an area of the first contact surface is substantially equal to an area of the second contact surface.

15. The package structure of claim 14, wherein an interface of a vertical cross-section of the solder joints and the underfill is a curved surface, and an interface of a vertical cross-section of the exposed portion of the through insulator vias and the underfill is a planar surface.

16. The package structure of claim 13, wherein each of the solder joints has a first contact surface, a second contact surface opposite to the first contact surface and a side surface connecting the first and second contact surfaces, wherein the first surface of the solder joint is connected to one of the conductive pads and the second contact surface of the solder joint is connected to one of the through insulator vias, and an area of the first contact surface is greater than an area of the second contact surface.

17. The package structure of claim 16, wherein an interface of a vertical cross-section of the solder joints and the underfill is a curved surface, and an interface of a vertical cross-section of the exposed portion of the through insulator vias and the underfill is a planar surface.

18. A manufacturing method of a package structure, comprising:
   providing a first package having at least one first semiconductor die and through insulator vias electrically connected to the at least one first semiconductor die and, the at least one first semiconductor die and the through insulator vias being encapsulated in an insulating encapsulation;
   providing, over the first package, a second package having at least one second semiconductor die and conductive pads electrically connected thereto;
   mounting the second package on the first package by forming solder joints therebetween, the solder joints being located between and electrically connecting the first package and the second package, wherein along the horizontal direction, a maximum size of each of the solder joints is greater than a maximum size of each of the through insulator vias and is greater than or substantially equal to a maximum size of each of the conductive pads, and wherein a maximum size of a surface of one of the solder joints physically contacting a surface of a respective one of the conductive pads is greater than a maximum size of the surface of the respective one of the conductive pads; and
   encapsulating the solder joints in an underfill, the underfill being located between the first package and the second package and covering a sidewall of the second package.

19. The manufacturing method of claim 18, wherein mounting the second package on the first package by forming the solder joints therebetween comprises:
   forming solder elements on the conductive pads, respectively;
   forming pre-solders on the through insulator vias; and
   connecting the solder elements and the pre-solders to form the solder joints between the first package and the second package, wherein the first package and the second package are electrically connected to each other through the solder joints.

20. The manufacturing method of claim 19, wherein connecting the solder elements and the pre-solders comprises performing a reflowing process.

* * * * *